(12) United States Patent
Zhu

(10) Patent No.: US 10,910,278 B2
(45) Date of Patent: Feb. 2, 2021

(54) SEMICONDUCTOR DEVICE, METHOD OF MANUFACTURING THE SAME AND ELECTRONIC DEVICE INCLUDING THE SAME

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 8 days.

(21) Appl. No.: 15/720,240

(22) Filed: Sep. 29, 2017

(65) Prior Publication Data

US 2018/0097106 A1 Apr. 5, 2018

(30) Foreign Application Priority Data

Sep. 30, 2016 (CN) .......................... 2016 1 0872541

(51) Int. Cl.
*H01L 21/8238* (2006.01)
*H01L 21/8234* (2006.01)
(Continued)

(52) U.S. Cl.
CPC ...... *H01L 21/823885* (2013.01); *B82Y 10/00* (2013.01); *G05B 23/0216* (2013.01); *G06T 19/006* (2013.01); *H01L 21/02532* (2013.01); *H01L 21/02636* (2013.01); *H01L 21/2252* (2013.01); *H01L 21/2258* (2013.01);
(Continued)

(58) Field of Classification Search
CPC ..... H01L 21/823487; H01L 21/823431; H01L 29/7827; H01L 29/78642; H01L 29/42392; H01L 29/7788; H01L 21/823885; H01L 29/66666
See application file for complete search history.

(56) References Cited

U.S. PATENT DOCUMENTS 5,554,870 A 9/1996 Fitch et al.
6,943,407 B2 * 9/2005 Ouyang .......... H01L 21/823807
257/329
(Continued)

FOREIGN PATENT DOCUMENTS

CN 1794466 A 6/2006
CN 1901225 A 1/2007
(Continued)

OTHER PUBLICATIONS

US 10,468,312 B2, 11/2019, Zhu et al. (withdrawn)
(Continued)

*Primary Examiner* — Jose R Diaz
(74) *Attorney, Agent, or Firm* — Schwegman Lundberg & Woessner, P.A.

(57) ABSTRACT

A semiconductor device, a method of manufacturing the same and an electronic device including the semiconductor device are provided. According to embodiments, the semiconductor device may include a substrate, a first source/drain layer, a channel layer and a second source/drain layer stacked in sequence on the substrate, and a gate stack surrounding a periphery of the channel layer. The channel layer includes a channel region close to its peripheral surface and a body region disposed on an inner side of the channel region.

30 Claims, 19 Drawing Sheets

(51) Int. Cl.

| | | |
|---|---|---|
| *H01L 29/66* | (2006.01) | |
| *H01L 29/786* | (2006.01) | |
| *H01L 29/423* | (2006.01) | |
| *B82Y 10/00* | (2011.01) | |
| *H01L 29/06* | (2006.01) | |
| *H01L 29/267* | (2006.01) | |
| *H01L 29/417* | (2006.01) | |
| *H01L 29/775* | (2006.01) | |
| *H01L 29/10* | (2006.01) | |
| *H01L 29/78* | (2006.01) | |
| *G05B 23/02* | (2006.01) | |
| *G06T 19/00* | (2011.01) | |
| *H04N 5/232* | (2006.01) | |
| *H04N 7/18* | (2006.01) | |
| *H01L 21/02* | (2006.01) | |
| *H01L 21/3065* | (2006.01) | |
| *H01L 29/04* | (2006.01) | |
| *H01L 29/165* | (2006.01) | |
| *H01L 21/225* | (2006.01) | |
| *H01L 21/324* | (2006.01) | |
| *H01L 29/08* | (2006.01) | |
| *H01L 29/15* | (2006.01) | |
| *H01L 29/205* | (2006.01) | |
| *H01L 29/45* | (2006.01) | |
| *H01L 29/778* | (2006.01) | |
| *H01L 21/308* | (2006.01) | |
| *H01L 21/822* | (2006.01) | |
| *H01L 27/092* | (2006.01) | |
| *H04N 13/332* | (2018.01) | |
| *H04N 13/111* | (2018.01) | |
| *H04N 13/366* | (2018.01) | |
| *H04N 13/398* | (2018.01) | |
| *G06F 3/0481* | (2013.01) | |
| *G06F 3/0482* | (2013.01) | |
| *G06K 9/00* | (2006.01) | |
| *H04N 5/247* | (2006.01) | |
| *H01L 21/3105* | (2006.01) | |

(52) U.S. Cl.
CPC ...... *H01L 21/3065* (2013.01); *H01L 21/3083* (2013.01); *H01L 21/324* (2013.01); *H01L 21/8221* (2013.01); *H01L 21/82345* (2013.01); *H01L 21/823412* (2013.01); *H01L 21/823418* (2013.01); *H01L 21/823475* (2013.01); *H01L 21/823487* (2013.01); *H01L 21/823807* (2013.01); *H01L 21/823814* (2013.01); *H01L 21/823842* (2013.01); *H01L 21/823864* (2013.01); *H01L 21/823871* (2013.01); *H01L 27/092* (2013.01); *H01L 29/04* (2013.01); *H01L 29/0638* (2013.01); *H01L 29/0653* (2013.01); *H01L 29/0676* (2013.01); *H01L 29/0847* (2013.01); *H01L 29/1037* (2013.01); *H01L 29/1054* (2013.01); *H01L 29/1083* (2013.01); *H01L 29/1095* (2013.01); *H01L 29/152* (2013.01); *H01L 29/165* (2013.01); *H01L 29/205* (2013.01); *H01L 29/267* (2013.01); *H01L 29/41741* (2013.01); *H01L 29/42376* (2013.01); *H01L 29/42392* (2013.01); *H01L 29/45* (2013.01); *H01L 29/6656* (2013.01); *H01L 29/66431* (2013.01); *H01L 29/66439* (2013.01); *H01L 29/66462* (2013.01); *H01L 29/66469* (2013.01); *H01L 29/66522* (2013.01); *H01L 29/66666* (2013.01); *H01L 29/66712* (2013.01); *H01L 29/66742* (2013.01); *H01L 29/775* (2013.01); *H01L 29/7788* (2013.01); *H01L 29/7813* (2013.01); *H01L 29/7827* (2013.01); *H01L 29/7848* (2013.01); *H01L 29/78642* (2013.01); *H04N 5/23238* (2013.01); *H04N 7/181* (2013.01); *G05B 2219/32014* (2013.01); *G06F 3/0482* (2013.01); *G06F 3/04817* (2013.01); *G06K 9/00711* (2013.01); *G06K 2009/00738* (2013.01); *G06K 2209/19* (2013.01); *H01L 21/31053* (2013.01); *H01L 29/0649* (2013.01); *H04N 5/247* (2013.01); *H04N 13/111* (2018.05); *H04N 13/332* (2018.05); *H04N 13/366* (2018.05); *H04N 13/398* (2018.05)

(56) References Cited

U.S. PATENT DOCUMENTS

| | | | |
|---|---|---|---|
| 7,781,827 B2 * | 8/2010 | Rao | ............... B82Y 10/00 |
| | | | 257/107 |
| 9,196,730 B1 | 11/2015 | Yu et al. | |
| 9,502,519 B2 | 11/2016 | Hu et al. | |
| 9,799,655 B1 | 10/2017 | Cheng et al. | |
| 10,020,396 B2 * | 7/2018 | Cantoro | ............ H01L 21/30612 |
| 10,629,498 B2 | 4/2020 | Zhu et al. | |
| 10,643,905 B2 | 5/2020 | Zhu et al. | |
| 10,714,398 B2 | 7/2020 | Zhu | |
| 2002/0076884 A1 | 6/2002 | Weis | |
| 2003/0116792 A1 | 6/2003 | Chen et al. | |
| 2003/0215989 A1 | 11/2003 | Kim et al. | |
| 2004/0157353 A1 * | 8/2004 | Ouyang | ............. H01L 29/1054 |
| | | | 438/38 |
| 2006/0226495 A1 | 10/2006 | Kwon | |
| 2008/0179664 A1 | 7/2008 | Rao | |
| 2011/0012085 A1 | 1/2011 | Deligianni et al. | |
| 2012/0104508 A1 | 5/2012 | Zhu et al. | |
| 2012/0319201 A1 | 12/2012 | Sun et al. | |
| 2013/0082333 A1 | 4/2013 | Chen et al. | |
| 2014/0175561 A1 | 6/2014 | Colinge et al. | |
| 2014/0264289 A1 | 9/2014 | Chuang et al. | |
| 2015/0017767 A1 | 1/2015 | Masuoka et al. | |
| 2015/0263094 A1 * | 9/2015 | Diaz | ............... H01L 29/7842 |
| | | | 257/24 |
| 2015/0380555 A1 | 12/2015 | Ohtou et al. | |
| 2016/0005850 A1 | 1/2016 | Zhao et al. | |
| 2016/0049397 A1 | 2/2016 | Chang et al. | |
| 2016/0064541 A1 | 3/2016 | Diaz et al. | |
| 2016/0211368 A1 | 7/2016 | Chen et al. | |
| 2016/0315084 A1 | 10/2016 | Wu et al. | |
| 2016/0336324 A1 | 11/2016 | Li et al. | |
| 2016/0372316 A1 | 12/2016 | Yang et al. | |
| 2017/0077231 A1 | 3/2017 | Balakrishnan et al. | |
| 2018/0040740 A1 | 2/2018 | Cantoro et al. | |
| 2018/0097065 A1 | 4/2018 | Zhu | |
| 2018/0108577 A1 | 4/2018 | Zhu et al. | |
| 2018/0254322 A1 | 9/2018 | Cheng et al. | |
| 2019/0287865 A1 | 9/2019 | Zhu et al. | |
| 2020/0203343 A1 | 6/2020 | Zhu et al. | |

FOREIGN PATENT DOCUMENTS

| | | |
|---|---|---|
| CN | 1906769 A | 1/2007 |
| CN | 101017825 A | 8/2007 |
| CN | 101295647 A | 10/2008 |
| CN | 101399207 A | 4/2009 |
| CN | 100521242 C | 7/2009 |
| CN | 101872778 A | 10/2010 |
| CN | 102412156 A | 4/2012 |
| CN | 103337519 A | 10/2013 |
| CN | 103515435 A | 1/2014 |
| CN | 103996709 A | 8/2014 |
| CN | 104103515 A | 10/2014 |
| CN | 104701376 A | 6/2015 |
| CN | 104916677 A | 9/2015 |
| CN | 105206670 A | 12/2015 |
| CN | 105280705 A | 1/2016 |

(56) References Cited

FOREIGN PATENT DOCUMENTS

| CN | 105810720 A | 7/2016 |
|---|---|---|
| EP | 0899790 A2 | 3/1999 |
| KR | 20090066491 A | 6/2009 |

OTHER PUBLICATIONS

US 10,566,249 B2, 02/2020, Zhu et al. (withdrawn)
US 10,600,696 B2, 03/2020, Zhu et al. (withdrawn)
US 10,679,907 B1, 06/2020, Zhu (withdrawn)
"U.S. Appl. No. 15/722,423, Non Final Office Action dated Jan. 10, 2019", 8 pgs.
"U.S. Appl. No. 15/718,586, Corrected Notice of Allowability dated May 16, 2019", 4 pgs.
"U.S. Appl. No. 15/718,586, Notice of Allowance dated May 6, 2019", 8 pgs.
"U.S. Appl. No. 15/718,586, Response filed Nov. 14, 2018 to Restriction Requirement dated Oct. 2, 2018", 9 pgs.
"U.S. Appl. No. 15/718,586, Response filed Apr. 3, 2019 to Non-Final Office Action dated Dec. 12, 2018", 12 pgs.
"U.S. Appl. No. 15/718,586, Restriction Requirement dated Oct. 2, 2018", 6 pgs.
"U.S. Appl. No. 15/718,586, Non Final Office Action dated Dec. 12, 2018", 12 pgs.
"U.S. Appl. No. 15/718,586, Non Final Office Action dated Jun. 26, 2019", 19 pgs.
"Chinese Application Serial No. 201710530250.X, Office Action dated Apr. 3, 2019", w/ Concise Statement of Relevance, (Apr. 3, 2019), 8 pgs.
"Chinese Application Serial No. 201710530298.0, Office Action dated May 22, 2019", w/ Concise Statement of Relevance, (May 22, 2019), 12 pgs.
"Chinese Application Serial No. 201710531812.2, Office Action dated May 21, 2019", w/ Concise Statement of Relevance, (May 21, 2019), 12 pgs.
"U.S. Appl. No. 15/718,586, Response filed Jan. 13, 2020 to Final Office Action dated Nov. 14, 2019", 11 pgs.
"Chinese Application Serial No. 201710530751.8, Office Action dated Oct. 9, 2019", w/ English Translation, (Oct. 9, 2019), 10 pgs.
"Chinese Application Serial No. 201710530194.X, Office Action dated Nov. 25, 2019", (Nov. 25, 2019), 8 pgs.
"Chinese Application Serial No. 201710530250.X, Office Action dated Nov. 14, 2019", (Nov. 14, 2019), 7 pgs.
"Chinese Application Serial No. 201710530684.X, Office Action dated Nov. 4, 2019", (Nov. 4, 2019), 7 pgs.
"Chinese Application Serial No. 201710530950.9, Office Action dated Nov. 14, 2019", (Nov. 14, 2019), 7 pgs.
"Chinese Application Serial No. 201710531762.8, Office Action dated Nov. 4, 2019", (Nov. 4, 2019), 15 pgs.
"U.S. Appl. No. 15/718,586, Advisory Action dated Feb. 3, 20", 3 pgs.
"U.S. Appl. No. 15/718,586, Notice of Allowance dated Mar. 25, 2020", 8 pgs.
"U.S. Appl. No. 15/718,586, Response filed Feb. 12, 2020 to Advisory Action dated Feb. 3, 2020", 10 pgs.
"U.S. Appl. No. 15/718,586, Corrected Notice of Allowability dated May 14, 2020", 2 pgs.
"Chinese Application No. 201710530250.X, Office Action dated Apr. 15, 2020", w/ English Translation, (Apr. 15, 2020), 13 pgs.
"Chinese Application No. 201710530297.6, Office Action dated Apr. 15, 2020", w/ English Translation, (Apr. 15, 2020), 12 pgs.
"Chinese Application No. 201710530298.0, Office Action dated Mar. 31, 2020", w/ English Translation, (Mar. 31, 2020), 20 pgs.
"Chinese Application No. 201710530685.4, Office Action dated Apr. 15, 2020", w/ English Translation, (Apr. 15, 2020), 10 pgs.
"Chinese Application No. 201710530950.9, Office Action dated Apr. 20, 2020", w/ English Translation, (Apr. 20, 2020), 11 pgs.
"Chinese Application No. 201710531811.8, Office Action dated Apr. 21, 2020", w/ English Translation, (Apr. 21, 2020), 4 pgs.
Clay, Simon, "Semiconductor Germanium Materials and Devices", Beijing: Metallurgical Industry Press, (Apr. 2010), 10 pgs.
"U.S. Appl. No. 15/718,586, Final Office Action dated Nov. 14, 2019", 16 pgs.
"U.S. Appl. No. 15/718,586, Response filed Sep. 26, 2019 to Non-Final Office Action dated Jun. 26, 2019", 9 pgs.
"Chinese Application Serial No. 201710530297.6, Office Action dated Aug. 28, 2019", w/ Concise Statement of Relevance, (Aug. 28, 2019), 8 pgs.
"Chinese Application Serial No. 201710530685.4, Office Action dated Aug. 28, 2019", w/ Concise Statement of Relevance, (Aug. 28, 2019), 8 pgs.
"Chinese Application Serial No. 201710531811.8 , Office Action dated Oct. 24, 2019", w/ Concise Statement of Relevance, 9 pgs.
"U.S. Appl. No. 15/718,586, Corrected Notice of Allowability dated Jun. 10, 2020", 2 pgs.
"U.S. Appl. No. 15/722,423, Notice of Allowance dated May 8, 2019", 7 pgs.
"U.S. Appl. No. 15/722,423, Notice of Allowance dated Jun. 28, 2019", 8 pgs.
"U.S. Appl. No. 15/722,423, Notice of Allowance dated Dec. 4, 2019", 8 pgs.
"U.S. Appl. No. 15/722,423, Response filed Nov. 14, 2018 to Restriction Requirement dated Oct. 18, 2018", 11 pgs.
"U.S. Appl. No. 15/722,423, Response filed Apr. 10, 2019 to Non-Final Office Action dated Jan. 10, 2019", 12 pgs.
"U.S. Appl. No. 15/722,423, Restriction Requirement dated Oct. 18, 2018", 6 pgs.
"U.S. Appl. No. 16/338,169, Non Final Office Action dated Jun. 11, 2020", (Jun. 11, 2020), 39 pgs.
"U.S. Appl. No. 16/421,009, Corrected Notice of Allowability dated Feb. 24, 2020", 2 pgs.
"U.S. Appl. No. 16/421,009, Corrected Notice of Allowability dated Apr. 3, 2020", 2 pgs.
"U.S. Appl. No. 16/421,009, Notice of Allowance dated Oct. 9, 2019", 9 pgs.
"Chinese Application Serial No. 201710530751.8 Office Action dated Oct. 9, 2019", (w/ Concise Statement of Relevance), 7 pgs.

\* cited by examiner

SEMICONDUCTOR DEVICE, METHOD OF MANUFACTURING THE SAME AND ELECTRONIC DEVICE INCLUDING THE SAME

CROSS-REFERENCE TO RELATED APPLICATION(S)

This application claims priority to Chinese Application No. 201610872541.2, filed on Sep. 30, 2016, the contents of which are incorporated herein by reference in their entirety.

TECHNICAL FIELD

The present disclosure relates generally to the semiconductor field, and more particularly, to a vertical semiconductor device, a method of manufacturing the same, and an electronic device including the semiconductor device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down, or the cost is difficult to be further reduced. In contrast, in a vertical device, a source, a gate and a drain are arranged in a direction substantially perpendicular to a substrate surface. As a result, compared to the planar device, the vertical device is easier to be scaled down, or the cost is easier to be reduced. A nanowire Vertical Gate-all-around Field Effect Transistor (V-GAAFET) is one of candidates for future high-performance devices.

However, for vertical devices such as nanowire devices, it is difficult to control, in particular, dynamically control their threshold voltages, which is important for reducing power consumption.

SUMMARY

In view of the above, the present disclosure aims to provide, among others, a vertical semiconductor device, a method of manufacturing the same, and an electronic device including the semiconductor device, by which it is possible to control, in particular, dynamically control the threshold voltage.

According to an aspect of the present disclosure, there is provided a semiconductor device, comprising: a substrate; a first source/drain layer, a channel layer and a second source/drain layer, which are stacked in sequence on the substrate; and a gate stack surrounding a periphery of the channel layer, wherein the channel layer includes a channel region close to its peripheral surface and a body region disposed on an inner side of the channel region.

According to a further aspect of the disclosure, there is provided a method of manufacturing a semiconductor device, comprising: providing a stack of a first source/drain layer, a precursor channel layer and a second source/drain layer on a substrate; defining an active region in the stack, such that the precursor channel layer has its periphery recessed with respect to that of the first source/drain layer and the second source/drain layer; forming a channel layer in a recess formed by recessing the periphery of the precursor channel layer with respect to that of the first source/drain layer and the second source/drain layer; and forming a gate stack surrounding the periphery of the channel layer. A body region may be formed in the precursor channel layer.

According to a further aspect of the present disclosure, there is provided an electronic device comprising an Integrated Circuit (IC) comprising the above described semiconductor device.

According to embodiments of the disclosure, the body region can be formed on an inner side the channel region. The body region may be a doped well region, or may contribute to forming a quantum well structure. By using such a body region, the threshold voltage of the device can be altered or changed. When applying a bias to the body region, the threshold voltage may be dynamically changed according to the bias.

According to embodiments of the present disclosure, the gate stack surrounds the periphery of the channel layer and the channel is formed in the channel layer. Thus, the gate length is determined substantially by the thickness of the channel layer. The channel layer may be formed by, for example, epitaxy, and thus the thickness thereof can be well controlled. Therefore, the gate length can also be well controlled. The channel layer may comprise a single-crystalline semiconductor material, resulting in improved carrier mobility and lower current leakage and thus enhanced device performances.

BRIEF DESCRIPTION OF THE DRAWINGS

The above and other objects, features, and advantages of the present disclosure will become more apparent from following descriptions on embodiments thereof with reference to attached drawings, in which.

Throughout the drawings, like or similar reference numerals denote like or similar elements.

DETAILED DESCRIPTION

Figure 1:
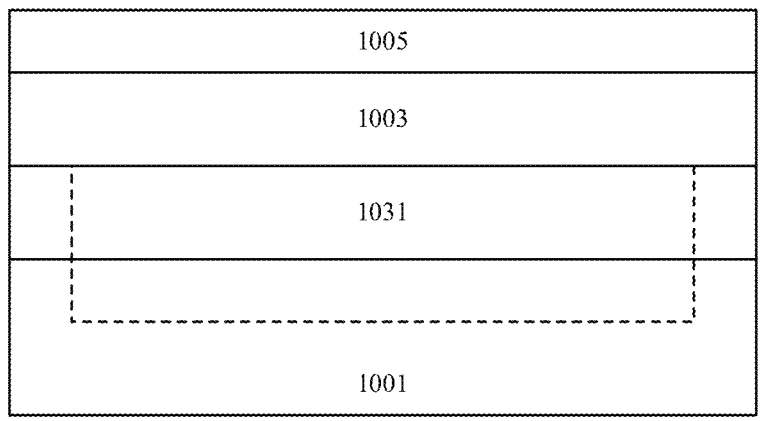
FIGS. 1-17 are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/ element, or otherwise there may be an intervening layer/ element interposed therebetween. Further, if a layer/element is "on" a further layer/element in an orientation, then the layer/element can be "under" the further layer/element when the orientation is turned.

A vertical semiconductor device according to embodiments of the present disclosure may comprise a first source/ drain layer, a channel layer and a second source/drain layer, which are stacked in sequence on a substrate. Those layers may be contiguous to each other, or may have other semiconductor layer(s) interposed therebetween, such as a leakage suppression layer and an ON current enhancement layer (which is a semiconductor layer having a band gap greater or smaller than its adjacent layer or layers). Source/drain regions of the semiconductor device may be formed in the first source/drain layer and the second source/drain layer, and a channel region may be formed in the channel layer. According to the embodiments of the disclosure, the semiconductor device may be a regular Field Effect Transistor (FET). In this case, the source/drain regions formed in the first source/drain layer and the second source/drain layer may have the same conductivity type (such as, n-type or p-type). Between the source/drain regions on opposite ends of the channel region, a conductive channel may be formed through the channel region. Alternatively, the semiconductor device may be a tunneling FET. In this case, the source/drain regions formed in the first source/drain layer and the second source/drain layer may have different conductivity types (n-type and p-type, respectively). If so, charged particles (such as electrons) may tunnel through the channel region from the source region to the drain region, which enable a conductive path between the source region and the drain region. Although the regular FET and the tunneling FET have different conduction mechanisms, both of them have an electrical property of controlling the conduction between the source/drain regions by a gate. Thus, the term "source/drain layer (region)" and "the channel layer (region)" can be used to describe both the the regular FET and the tunneling FET, although there is no "channel" in common sense for the tunneling FET.

A gate stack may be formed to surround a periphery of the channel layer. The channel layer may comprise a channel region close to its peripheral surface and a body region disposed on an inner side of the channel region. The body region may be doped to form a well region. Alternatively, the body region can comprise a semiconductor material whose material characteristic is different from the channel region (which can form a quantum well structure as discussed below). The well region and the channel region may have different doping characteristics (generally, the channel region is not doped intentionally or doped lightly, and the well region is doped heavily with respect to the channel region), thus there may be an interface between the well region and the channel region. For example, the doping distribution may have a sharp change from the channel region to the well region. Thus, the well region can constitute an ultra-steep well structure with respect to the channel region. The channel region may be opposite to the gate stack, so that the channel or conductive channel therein can be controlled by the gate stack. The body region is disposed on the inner side of the channel region, to have an influence on the channel region (and thus on a threshold voltage of the device). A bias may be applied to the body region to control the threshold voltage dynamically.

The channel layer may be made of a single-crystalline semiconductor material, to improve the performance of the device. Certainly, the first and second source/drain layers may be also made of a single-crystalline semiconductor material. In this case, the single-crystalline semiconductor material of the channel layer may have the same crystalline structure as the source/drain layers.

For example, in order to implement such a configuration of having the body region in the channel layer, the channel layer may include a first semiconductor material and a second semiconductor material surrounding a periphery of the first semiconductor material. Thus, the body region may be substantially formed in the first semiconductor material, and the channel region may be substantially formed in the second semiconductor material. The body region may or may not be doped. In addition, gate dielectric in the gate stack, the channel region (the second semiconductor material) and the body region (the first semiconductor material) may form a quantum well structure. The first semiconductor material and the second semiconductor material may be formed and/or doped respectively. Therefore, it is relatively easy to achieve different doping properties and/or material characteristics (such as, band gap characteristic, to form the quantum well) as desired.

According to embodiments of the disclosure, the gate length may be determined by the thickness of the channel layer, instead of timing etching as in the conventional art. The channel layer may be formed by, for example, epitaxy, and thus the thickness thereof can be well controlled. Thus, the gate length may be well controlled.

The periphery of the first semiconductor material may be recessed inwards with respect to that of the first and second source/drain layers to form a recess, and the second semiconductor material may be formed in the recess. In this way, the channel region formed in the second semiconductor material may be self-aligned to the body region formed in the first semiconductor material.

In addition, the channel layer as a whole may be recessed inwards with respect to the periphery of the first and second source/drain layers. In this way, the formed gate stack may be embedded in the recess of the channel layer with respect to the first and second source/drain layers, to reduce or even avoid overlap with the source/drain regions and thus contribute to reduced parasitic capacitance between the gate and the source/drain.

The second semiconductor material may form a heterojunction with respect to at least one of the first source/drain layer, the second source/drain layer and the first semiconductor material. The performance of the device can be improved, for example, the carrier mobility can be improved, due to the heterojunction. For an n-type device, the second semiconductor material may have a concentration of electrons greater than that in the first semiconductor material on an ON state. For a p-type device, the second semiconductor material may have a concentration of holes greater than that in the first semiconductor material in an ON state. For example, for an n-type device, the second semiconductor material has a conduction band at an energy level lower than that in the first semiconductor material. For a p-type device, the second semiconductor material has a valance band at an energy level higher than that in the first semiconductor material. With such a configuration, the carriers (electrons or holes) may be substantially restricted within second semiconductor material, i.e. the channel region.

According to embodiments of the disclosure, the source/ drain regions can be formed in portions of the first source/ drain layer and the second source/drain layer close to their respective peripheral surface. The source/drain region above the channel layer and the source/drain region under the channel layer may be connected through the channel region (in other words, the second semiconductor material). Doping of the source/drain regions may move partially into end portions of the channel layer (in other word, the second semiconductor material) close to the source/drain regions. This configuration can contribute to reducing the resistance between the source/drain region and the channel region when the device is ON, thereby improving the performance of the device.

According to embodiments of the disclosure, the channel layer (including the first semiconductor material and the second semiconductor material) may include a semiconductor material different from that of the first and second source/drain layers. Thus, it facilitates processing the channel layer by, for example, selective etching, to recess the channel layer with respect to the first and second source/drain layers. Further, the first source/drain layer and the second source/drain layer may comprise the same semiconductor material as each other.

For example, the first source/drain layer may be a semiconductor layer epitaxially grown on the substrate, the channel layer may be a semiconductor layer epitaxially grown on the first source/drain layer, and the second source/drain layer may be a semiconductor layer epitaxially grown on the channel layer. Due to the epitaxy, a distinct crystal interface can be formed between at least some of the adjacent layers.

Such a semiconductor device may be manufactured as follows. Specifically, a stack of a first source/drain layer, a precursor channel layer and a second source/drain layer may be provided on a substrate. As discussed above, the stack may be formed by epitaxially growing the first source/drain layer on the substrate, epitaxially growing the channel layer on the first source/drain layer, and epitaxially growing the second source/drain layer on the channel layer. Each of the epitaxially grown layers, especially, the channel layer, can be controlled in thickness during the growth.

For the first source/drain layer, the precursor channel layer and the second source/drain layer stacked as above, an active region may be defined therein. For example, those layers may be selectively etched in sequence into a desired shape. Generally, the active region may have a pillar shape (for example, a cylindrical shape). For convenience of connection to the source/drain region formed in the first source/drain layer later, etching of the first source/drain layer may be performed with respect to only an upper portion of the first source/drain layer, so that a lower portion of the first source/drain layer may extend beyond the periphery of the upper portion. The periphery of the precursor channel layer may be recessed with respect to the periphery of the first and second source/drain layers, to define a space for receiving the channel layer and the gate stack. For example, this may be implemented by selective etching. Next, the channel layer (in which a channel region will be formed later) may be formed in a recess which is formed by recessing the periphery of the precursor channel layer with respect to the periphery of the first and second source/drain layers, and the gate stack may be formed to surround the periphery of the channel layer. The gate stack may be embedded in the recess.

The precursor channel layer may be doped at a certain conduction type, so as to form a well region later. For example, this may be implemented by in-situ doping during growing the precursor channel layer, or by implanting dopants into the precursor channel layer. Certainly, the precursor channel layer may not be doped, and its material may be appropriately selected (based on, for example, energy level characteristic) so as to form a heterojunction or a well wall for a quantum well structure. Of course, the body region may form a quantum well structure while being doped.

Source/drain regions may be formed in the first and second source/drain layers. For example, this may be implemented by doping the first and second source/drain layers. For example, ion implantation or plasma doping may be performed. In an advantageous example, a position hold layer may be formed in the recess of the periphery of the precursor channel layer with respect to the periphery of the first and second source/drain layers. Then, a dopant source layer may be formed on surfaces of the first and second source/drain layers, and dopants may be driven by, for example, annealing, from the dopant source layer into the first and second source/drain layers. Preferably, dopants can be driven only into the portions of the first and second source/drain layers close to their respective peripheral surfaces. The position hold layer may prevent the dopants from the dopant source layer from being driven into the precursor channel layer. In addition, thermal treatment may be performed to drive some of the dopants from the source/drain layer into the channel layer, especially, the end portions of the channel layer.

The present disclosure can be implemented in various ways, some of which are exemplified in the following with reference to the drawings.

FIGS. 1-17 are schematic views showing a flow of manufacturing a semiconductor device according to an embodiment of the present disclosure As shown in FIG. 1, a substrate 1001 is provided. The substrate 1001 may be a substrate in any form, for example, but not limited to, a bulk semiconductor substrate such as a bulk silicon (Si) substrate, a Semiconductor on Insulator (SOI) substrate, a compound semiconductor substrate such as a SiGe substrate, or the like. Hereinafter, the bulk Si substrate will be described by way of example for convenience of description.

According to the embodiments of the disclosure, a heterojunction structure may be formed advantageously. In order to improve the quality of other semiconductor layers grown later, a buffer layer 1031 may be formed on the substrate 1001 by, for example, epitaxy. In the example, the buffer layer 1031 may include $Si_{1-x}Ge_x$, wherein x is between 0 and 1. The buffer layer 1031 is relaxed at least on the top.

A precursor channel layer 1003 and another semiconductor layer 1005 can be formed on the buffer layer 1031 in sequence by, for example, epitaxy. For example, the precursor channel layer 1003 may include $Si_{1-y}Ge_y$, wherein y is between 0 and 1, with a thickness of 10-100 nm. The other semiconductor layer 1005 may include $Si_{1-z}Ge_z$, wherein z is between 0 and 1, with a thickness of 20-50 nm. Here, in other to achieve selective etching, the composition of the precursor channel layer 1003 may be different from the composition of the buffer layer 1031 and the composition of the other semiconductor layer 1005, i.e., y may be different from x and z. The composition of buffer layer 1031 may be same as (i.e., x=z) or different from that of the other semiconductor layer 1005.

Certainly, the materials of the respective semiconductor layers are not limited thereto. For example, the buffer layer 1031, the precursor channel layer 1003 and the semiconductor layer 1005 may include a group IV semiconductor material or a group III-V compound semiconductor, such as, any of Ge, SiGeSn, GeSn, GaAs, InGaAs, InP, AlGaAs, InAlAs, InAs, InGa, InAlGa, GaN, InSb, InGaSb or any combination thereof.

The precursor channel layer 1003 can be doped to a certain extent, so as to form a well region later. For example, the precursor channel layer 1003 may be doped by ion implantation or doped in situ while being grown. P-type doping (for example, B or In impurities with a concentration of about 5E17-2E19 cm$^{-3}$) may be performed for an n-type device, and n-type doping (for example, As or P impurities with a concentration of about 1E17-2E19 cm$^{-3}$) may be performed for a p-type device. In addition, in order to reduce the influence of the doping of the body region on the channel layer, the doping concentration of the body region may decrease as the distance from the gate stack decreases.

In addition, a well region can be formed under the precursor channel layer 1003 (for example, in the substrate 1001 and the buffer layer 1031), as shown by a dashed block in the figure. For example, such a structure can be achieved by ion implantation. A p-type well region may be formed for an n-type device, and an n-type well region may be formed for a p-type device.

Figure 2A:
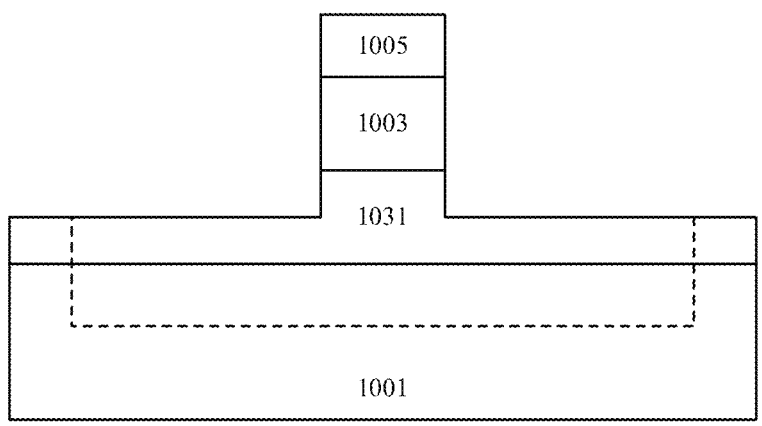
Figure 2B:
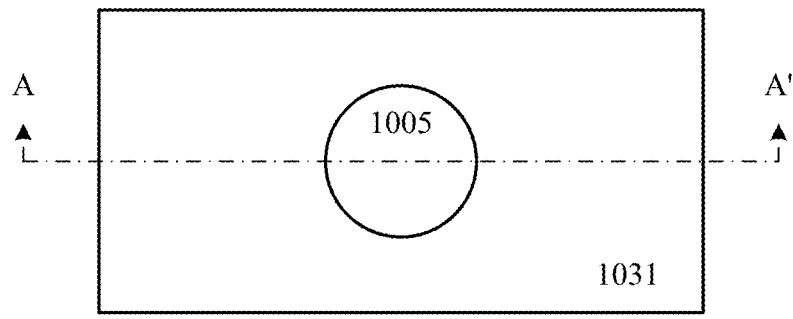

Next, an active region can be defined for the device. For example, this can be done as follows. Specifically, as shown in FIGS. 2(a) and 2(b) (FIG. 2(a) is a sectional view, and FIG. 2(b) is a top view with line AA' indicating the location where the sectional view is taken), photoresist (not shown) may be formed on the stack of the buffer layer 1013, the precursor channel layer 1003 and the semiconductor layer 1005, and then patterned into a desired shape (a substantially circular shape in this example) by photolithography (exposing and developing). By using the patterned photoresist as a mask, the semiconductor layer 1005, the precursor channel layer 1003 and the buffer layer 1031 may be selectively etched in sequence by, for example, Reactive Ion Etching (RIE). The etching goes into the buffer layer 1031, but stops before reaching a bottom surface of the buffer layer 1031. Thus, the semiconductor layer 1005, the precursor channel layer 1003, and an upper portion of the buffer layer 1031 are in a pillar shape (a cylindrical shape in this case) after being etched. The RIE may be performed in, for example, a direction substantially perpendicular to a surface of the substrate, and thus the pillar shape is substantially perpendicular to the substrate surface. After that, the photoresist may be removed.

Figure 3:
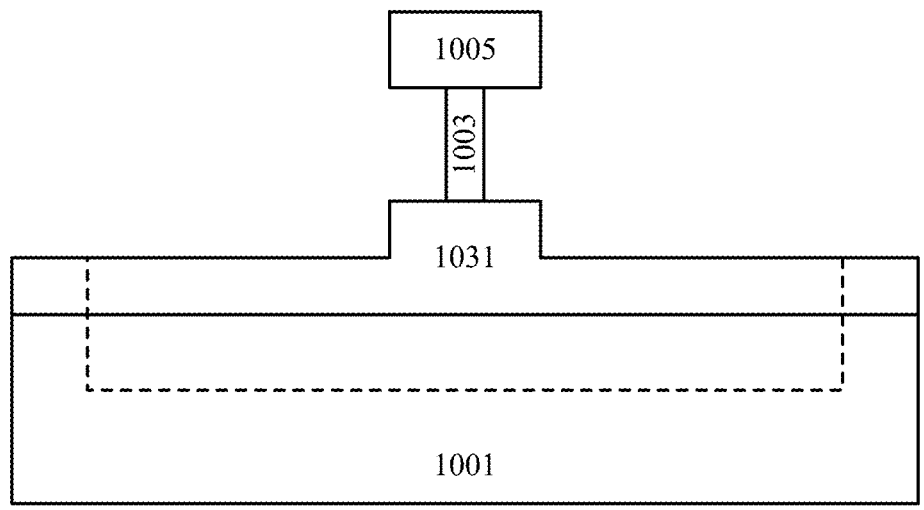

Then, as shown in FIG. 3, a periphery of the precursor channel layer 1003 may be recessed (in this example, in a lateral direction substantially parallel to the substrate surface) with respect to that of the buffer layer 1031 and the semiconductor layer 1005. For example, this can be done by selectively etching the precursor channel layer 1003 further with respect to the buffer layer 1031 and the semiconductor layer 1005. Such selective etching can be done by atomic layer etching, digital etching, or the like.

If the precursor channel layer 1003 is not doped during the above process of forming the precursor channel layer 1003, the precursor channel layer 1003 can be doped at this time. For example, a dopant source layer may be formed on a surface of the structure shown in FIG. 3. Dopants may be driven from the dopant source layer into the precursor channel layer 1003 by annealing (certainly, the dopants may also be driven into the buffer layer 1031 and the semiconductor layer 1005, which may be further doped at a desired conductivity type and concentration by source/drain doping). After that, the dopant source layer may be removed. Due to the fact that the number of dopant atoms driven into the precursor channel 1003 may be substantially the same among different devices formed on the substrate, such a method for driving the dopants may reduce the threshold fluctuation among the different devices.

In the recess which is formed by recessing the periphery of the precursor channel layer with respect to the periphery of the upper portion of the buffer layer 1031 and the semiconductor layer 1005, there is to be a channel layer in which a channel region is to be formed. The channel layer may constitute an active region of the device along with the previously formed buffer layer 1031, precursor channel layer 1003 and semiconductor layer 1005 (here, the precursor channel layer 1003 may act as the body region). In order to avoid unnecessary influence of the subsequent process for forming the source/drain regions (doping process) on the channel layer, the source/drain regions may be formed before the channel layer is formed.

Figure 4:
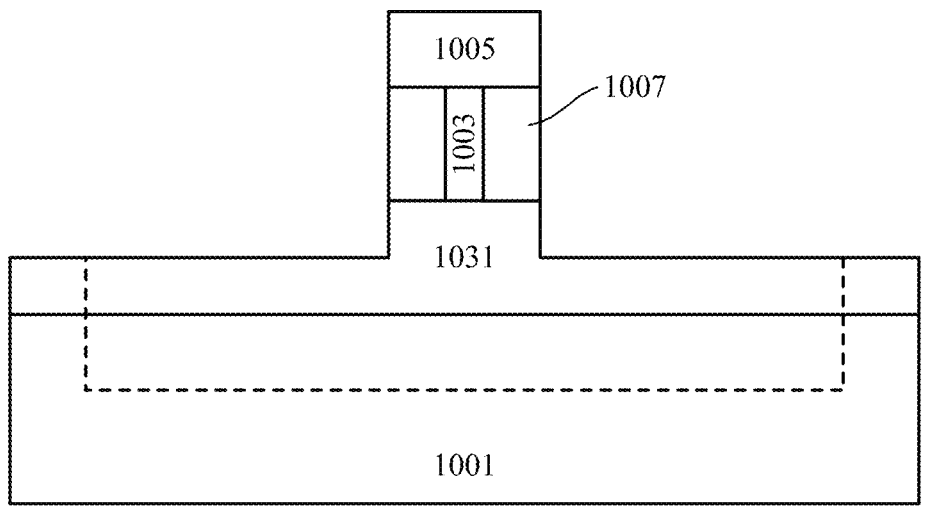

In addition, in order to avoid an influence of the subsequent process on the precursor channel layer 1003 or avoid leaving any unnecessary material in the recess which may affect the subsequent process, a material layer may be filled in the recess to take over the space in the recess (thus, the material layer can be referred to as "a position hold layer"). For example, this can be done by depositing a nitride on the structure shown in FIG. 3 and etching the deposited nitride back by, for example, RIE. The RIE may be performed in a direction substantially perpendicular to the substrate surface, such that the nitride may be only remained in the recess, thereby forming the position hold layer 1007, as shown in FIG. 4. In this case, the position hold layer 1007 may substantially fill the recess up.

According to embodiments of the disclosure, shallow trench isolation (STI) may be provided to define an extent of the active region. For example, as shown in FIG. 5, trenches for defining the extent of the active region can be formed in the buffer layer 1031 and the substrate 1001 by lithography, and can be filled with an insulating material, such as oxide, so as to form STI 1051.

Next, the source/drain regions may be formed in the buffer layer 1031 and the semiconductor layer 1005. This may be done by doping the buffer layer 1031 and the semiconductor layer 1005. For example, this may be done as follows.

Figure 5:
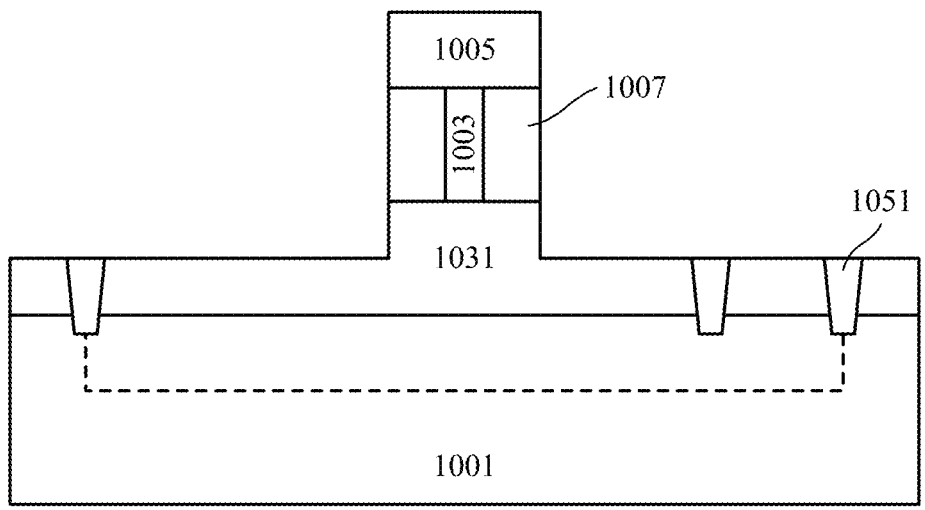
Figure 6:
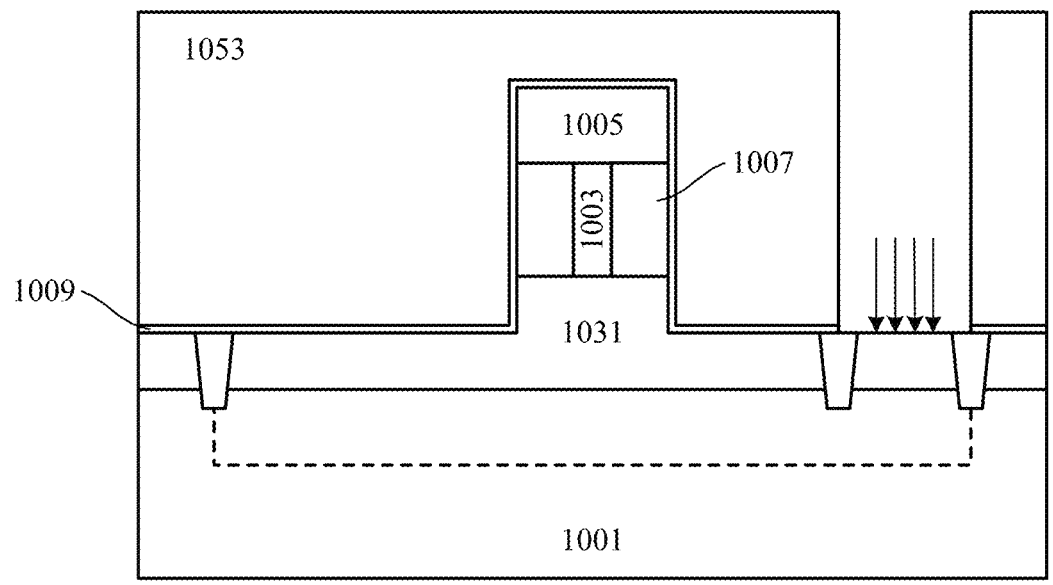

In particular, as shown in FIG. 6, a dopant source layer 1009 may be formed on the structure of FIG. 5. For example, the dopant source layer 1009 may include oxide such as silicon oxide, containing dopants therein. For an n-type device, n-type dopants may be included, and for a p-type device, p-type dopants may be included. Here, the dopant source layer 1009 may be a thin film, which can be formed in a substantially conformal manner on a surface of the structure shown in FIG. 5 by, for example, Chemical Vapor Deposition (CVD) or Atom Layer Deposition (ALD).

Photoresist 1053 may be formed on the dopant source layer 1009, and then the dopant source layer 1009 may be patterned by using the photoresist 1053. In this embodiment, a body contact can be formed as follows. In order to provide the body contact, doping with a different type from that of the source/drain regions is required. Thus, as shown in FIG. 6, the dopant source layer 1009 is patterned to be removed from a region in which the body contact is to be formed. This region can be doped by, for example, ion implantation, as shown by arrows in the figure. For example, p-type impurities (for example, B or In) may be implanted for an n-type device, and n-type impurities (for example, As or P) may be implanted for a p-type device.

Figure 7:
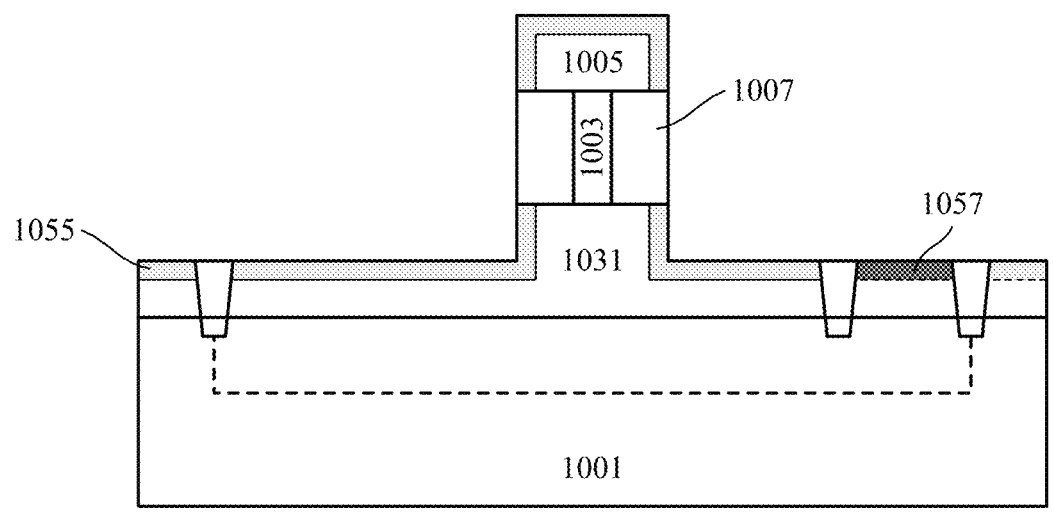

Next, as shown in FIG. 7, the dopants included in the dopant source layer 1009 may be driven into the active region by, for example, annealing, so that doped regions 1055 are formed therein, as indicated by shadowed regions in the figure. More specifically, one of the source/drain regions may be formed in the buffer layer 1031, and the other of the source/drain regions may be formed in the semiconductor layer 1005. Here, driving the dopants into the active region can be well controlled, so that the dopants may substantially only remain in portions of the buffer layer 1031 and the semiconductor layer 1005 close to their respective surfaces. Other portions of the buffer layer 1031 and the semiconductor layer 1005 may not be doped substantially. After that, the dopant source layer 1009 may be removed.

Further, due to the annealing process, the impurities previously implanted for the body contact region may be activated, forming a contact region 1057. The contact region 1057 may have the same conductivity type as the well region in the buffer layer 1031 and the substrate 1001, but with a higher concentration.

In the above example, the source/drain regions are formed by driving the dopants from the dopant source layer into the active region. However, the present disclosure is not limited thereto. For example, the source/drain regions may be formed by ion implantation, plasma doping (for example, conformal doping along the surface of the structure shown in FIG. 5), or the like.

In the example, the dopant source layer 1009 may include a portion thereof extending along a horizontal surface of the buffer layer 1031, such that the doped region formed in the buffer layer 1031 may extend beyond the periphery of the overlying active region. In this way, it is relatively easy to make electrical contact to the source/drain region formed in the buffer layer 1031 through this doped region in the following process.

In the example, the buffer layer 1031 and the semiconductor layer 1005 can be doped to have the same conductivity type, thereby resulting in the source/drain regions with the same conductivity type. However, the present disclosure is not limited thereto. For example, the buffer layer 1031 and the semiconductor layer 1005 can be doped to have different conductivity types, thereby acquiring the source/drain regions with different conductivity types (in this case, resulting in a tunneling FET). For example, after forming the dopant source layer with a certain conductivity type as shown in FIG. 6, a shielding layer (such as, nitride) may be formed. The shielding layer may be etched back so that its top surface is disposed at a level between top and bottom surfaces of the precursor channel layer 1003, thereby shielding a portion of the dopant source layer formed on side walls of the buffer layer 1031 and exposing a portion of the dopant source layer formed on side walls of the semiconductor layer 1005. Subsequently, the exposed portion of the dopant source layer on the side walls of the semiconductor layer 1005 may be removed, and another dopant source layer with the other conductivity type can be formed on the side walls of the semiconductor layer 1005.

Figure 8:
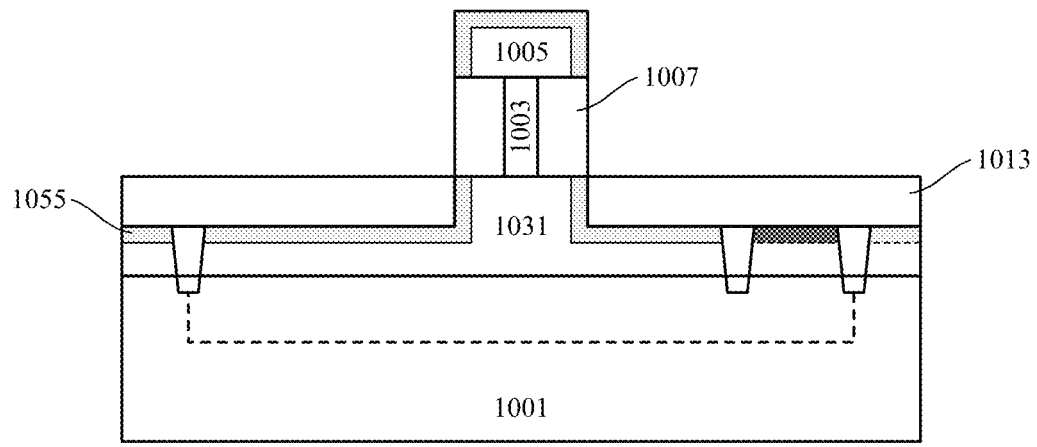

An isolation layer may be formed around the active region for electrical isolation. For example, as shown in FIG. 8, oxide can be deposited on the structure of FIG. 7 and etched back to form the isolation layer 1013. Before the back etching, the deposited oxide may be planarized by, for example, chemical-mechanical polishing (CMP) or sputtering. Here, the isolation layer 1013 may have its top surface close to an interface between the precursor channel layer 1003 and the buffer layer 1031.

Figure 9:
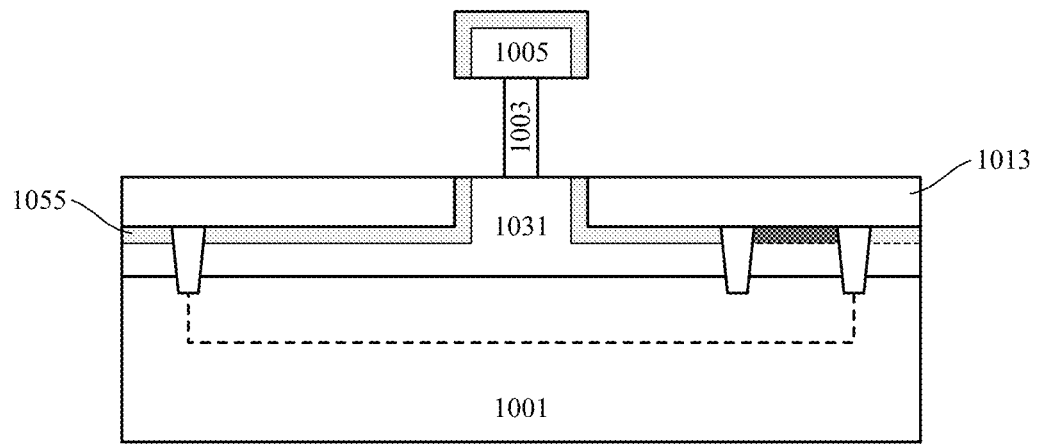

In forming the isolation layer, the position hold layer 1007 may be remained, so as to prevent the material of the isolation layer from entering the recess which is to receive the gate stack. After that, as shown in FIG. 9, the position hold layer 1007 can be removed to release the space in the recess. For example, the position hold layer 1007 (nitride) is selectively etched with respect to the isolation layer 1013 (oxide) and the semiconductor layer 1005 and the precursor channel layer 1003 (SiGe).

Next, the channel layer in which a channel region is to be formed may be formed in the recess.

Figure 10:
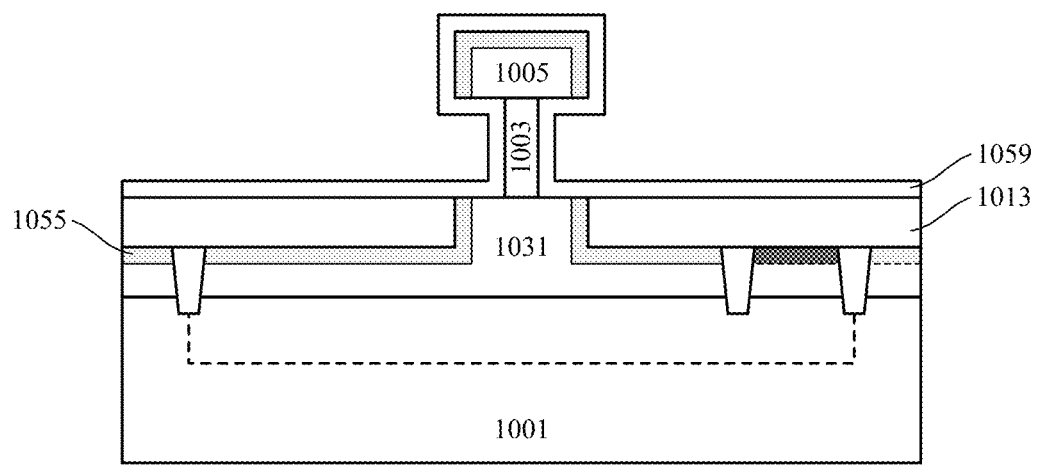

To do this, as shown in FIG. 10, the channel layer 1059 may be formed on the structure of FIG. 9 by, for example, deposition or epitaxy. The channel layer may have a substantially even thickness (for example, about 2-10 nm) or may be faced. In case of epitaxy, the semiconductor layers may have a distinct crystal interface therebetween.

The material of the channel layer 1059 may be selected to facilitate the performance of the device. For example, the channel layer 1059 may include a semiconductor material which can contribute to an increased ON current and/or a reduced OFF current. For example, for an n-type device, the channel layer 1059 may have a concentration of electrons therein greater than that in the precursor channel layer 1003 in an ON state; and for a p-type device, the channel layer 1059 may have a concentration of holes therein greater than that in the precursor channel layer 1003 in an ON state. In addition, the channel layer 1059 may form a heterojunction (or even a quantum well structure) with at least one of the buffer layer 1031, the precursor channel layer 1003 and the semiconductor layer 1005. Here, due to stress release in the precursor channel layer 1003, the stress in the thin channel layer 1059 can be released. Thus, the material of the channel layer 1059 can be widely selected, as long as there is no distinct crystal defect, such as, dislocations. For example, the channel layer 1059 may include a group IV of semiconductor material or a group III-V compound semiconductor, such as, any one of SiGe, Ge, SiGeSn, GeSn, GaAs, InGaAs, InP, AlGaAs, InAlAs, InAs, InGa, InAlGa, GaN, InSb, InGaSb or any combination thereof.

In the example (the buffer layer 1031 includes $Si_{1-x}Ge_x$, the precursor channel layer 1003 includes $Si_{1-y}Ge_y$, and the semiconductor layer 105 include $Si_{1-z}Ge_z$,), the channel layer 1059 may comprise $Si_{1-c}Ge_c$ (wherein c is between 0 and 1). Here, c may be close to 1 and may not cause a distinct dislocation, and a bigger c may facilitate improving the performance of the device. Such a $Si_{1-c}Ge_c$ layer may have following advantages. First of all, it may form a quantum well, thereby confining the carriers in the thin channel layer, so as to enhance the carrier mobility and improve the performance of the device. Furthermore, the doped precursor channel layer 1003 (or in other words, the well region) may also facilitate confining the carriers in the thin channel layer. Preferably, the concentration of Ge in the channel layer 1059 may be not uniform. For example, the concentration is small at the beginning of the growth so as to reduce the defects and then increases gradually. Thus, the concentration of Ge in the channel layer 1059 may increase gradually from a surface close to the first semiconductor material to a surface away from the first semiconductor material. In another embodiment, the concentration of Ge in the channel layer 1059 may decrease gradually from the surface close to the first semiconductor material to the surface away from the first semiconductor material.

The channel layer 1059 may be deposited or grown by a low temperature process at, for example, a temperature below 800° C., so as to reduce the diffusion of the dopants in the precursor channel layer 1003 or body region into this layer. This results in an ultra-steep doping distribution between the channel layer 1059 and the precursor channel layer 1003, and thus there can be a doping interface. That is, the precursor channel layer 1003 can form an ultra-steep well structure with respect to the channel layer 1059.

Figure 11:
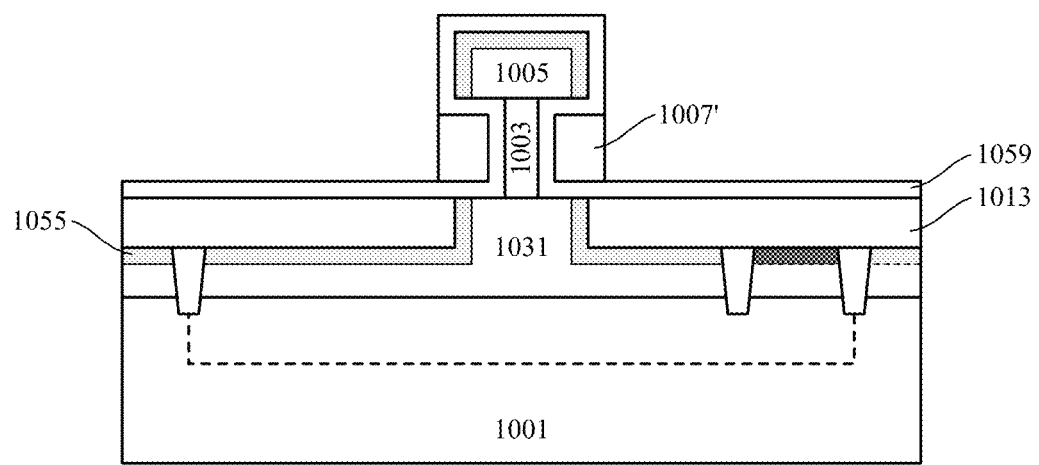
Figure 12:
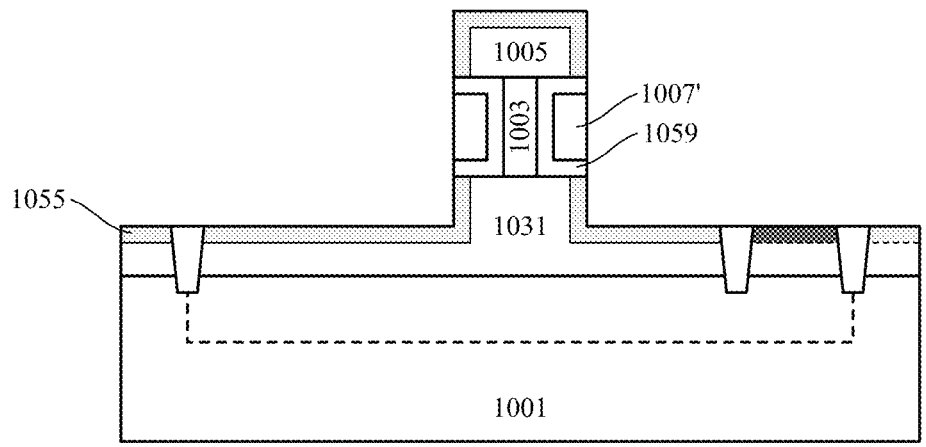

After that, a portion of the channel layer 1059 outside the recess may be removed. For example, as shown in FIG. 11, another position hold layer 1007' may be formed in the recess. The position hold layer 1007' may include nitride and can be formed as described above with reference to FIG. 4. Next, as shown in FIG. 12, a portion of the channel layer 1059 within the recess can be shielded by the position hold layer 1007', and a portion of the channel layer 1059 outside the recess is then removed. For example, RIE may be performed on the channel layer 1059 in, for example, a direction substantially perpendicular to the substrate surface. Advantageously, after performing the RIE on the channel layer 1059, the RIE may be further performed on the position hold layer 1007', and then be performed on the channel layer 1059 again. In this way, remaining portions of the channel layer 1059 and the position hold layer 1007' are completely within the recess.

Here, in order to form silicide on the surfaces of the source/drain regions later for electrical contact, RIE may be performed further on the isolation layer 1013, so as to expose the surfaces of the source/drain regions. FIG. 12 shows a case that the isolation layer 1013 is removed. For example, a layer of NiPt can be deposited on the structure of FIG. 12 (the content of Pt is about 1-10%), and annealing may be conducted at a temperature of about 200-600° C., such that NiPt reacts with SiGe to produce a layer of silicide (in this example, SiNiPt) (not shown). After that, the rest of the unreacted NiPt can be removed.

In this way, the active region of the semiconductor device is thus defined (the buffer layer 1031 especially the source/drain region therein, the channel layer 1059, and the semiconductor layer 1005 especially the source/drain region therein, after being etched). The body region 1003 is provided on the inner side of the channel layer 1059. The ends of the channel layer 1059 are connected to the source/drain regions formed in the buffer layer 1039 and the semiconductor layer 1059. In this example, the active region is substantially in a pillar shape. In the active region, the upper portion of the buffer layer 1031 may have its periphery substantially aligned with that of the semiconductor layer 1005, while the periphery of the second channel layer 1009 is relatively recessed.

Certainly, the active region is not limited to the specific shape illustrated, but can be formed in different shapes according to design layout. For example, the active region may be in an ellipse, a square, a rectangle, or the like in the top view.

Figure 13:
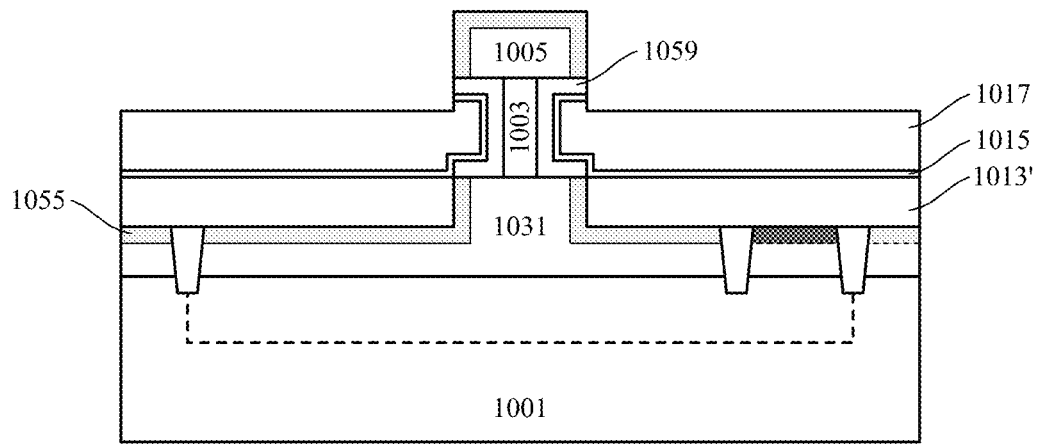

Then, as shown in FIG. 13, a gate stack may be formed in the recess. Specifically, a gate dielectric layer 1015 and a gate conductor layer 1017 may be deposited in sequence on the structure shown in FIG. 12 (with the position hold layer 1007' removed, and also an isolation layer 1013' formed again in the same way if the isolation layer 1013 is removed as described above), and then the deposited gate conductor layer 1017 (and optionally the gate dielectric layer 1015) may be etched back, so that a portion thereof outside the recess has its top surface at a level not higher than and preferably lower than the top surface of the precursor channel layer 1003. For example, the gate dielectric layer 1015 may comprise high-K dielectric such as $HfO_2$, the gate conductor layer 1017 may comprise a metal gate conductor. Further, there may be a work function adjustment layer disposed between the gate dielectric layer 1015 and the gate conductor layer 1017. An interfacial layer of, for example, oxide, may be formed before the formation of the gate dielectric layer 1015.

In this way, the gate stack can be embedded into the recess, and thus overlap an entire length of the channel layer 1059 extending between the source/drain regions (which corresponds to the gate length).

In addition, depending on the location of the top surface of the isolation layer 1013', the gate stack may overlap the source/drain region formed in the buffer layer 1031 to some extent (for example, in a case that the isolation layer 1013' has its top surface at a level lower than an interface between the precursor channel layer 1003 and the buffer layer 1031). In this case, the parasitic capacitance between the gate and the source/drain will be increased. Thus, preferably, the isolation layer 1013' has its top surface at a level not lower than the interface between the precursor channel layer 1003 and the buffer layer 1031.

Figure 14:
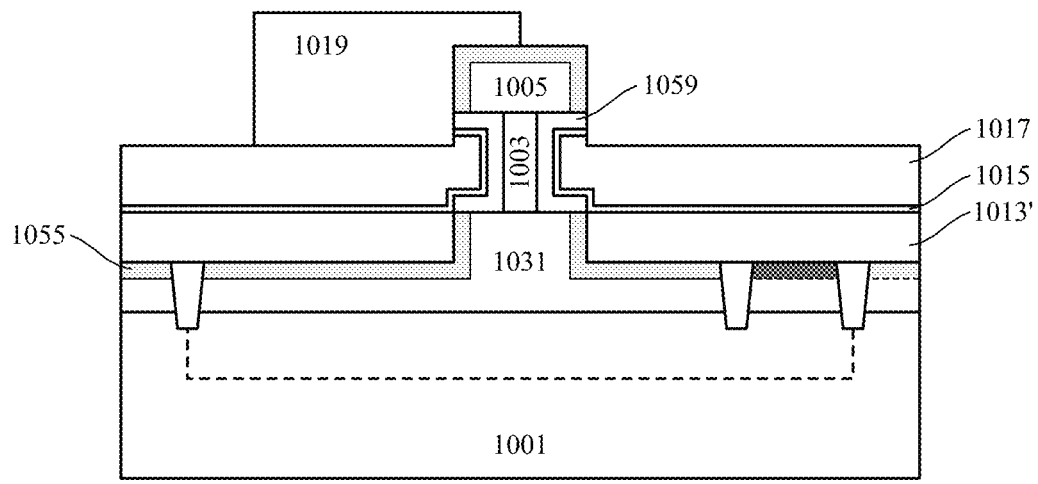

Next, the gate stack may have its shape adjusted to facilitate manufacturing of contacts later. For example, as shown in FIG. 14, photoresist 1019 may be formed on the structure shown in FIG. 13. The photoresist 1019 may be patterned by, for example, photolithography, to cover one portion of the gate stack outside the recess (the left portion in this example, which can extend in a strip shape), while exposing another portion of the gate stack outside the recess (the right portion in this example).

Figure 15:
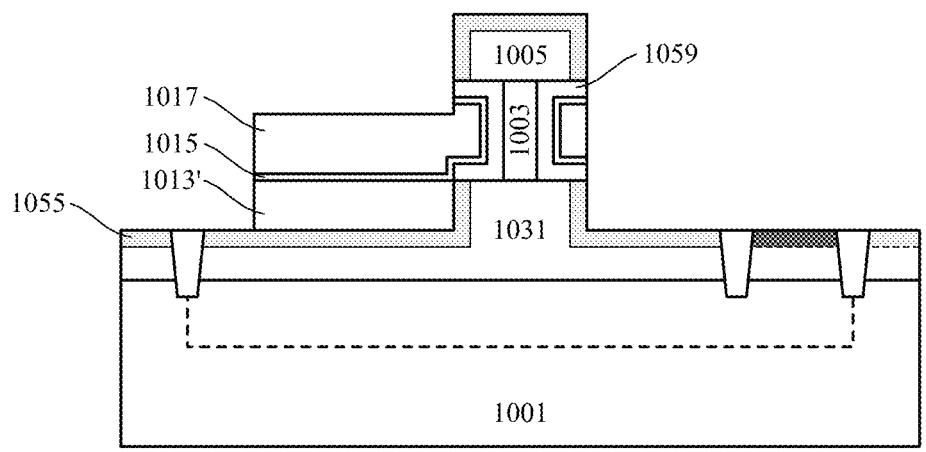

Then, as shown in FIG. 15, the gate conductor layer 1017 may be selectively etched by, for example, RIE, with the photoresist 1019 as a mask. Thus, the covered portion of the gate conductor layer 1017, in addition to a portion thereof remaining in the recess, is remained. Later, an electrical connection to the gate stack can be achieved by this portion.

According to another embodiment, the gate dielectric layer 1015 and the isolation layer 1013' may be selectively etched further by, for example, RIE (not shown), to facilitate the manufacture of a liner later. After that, the photoresist 1019 may be removed.

Figure 16:
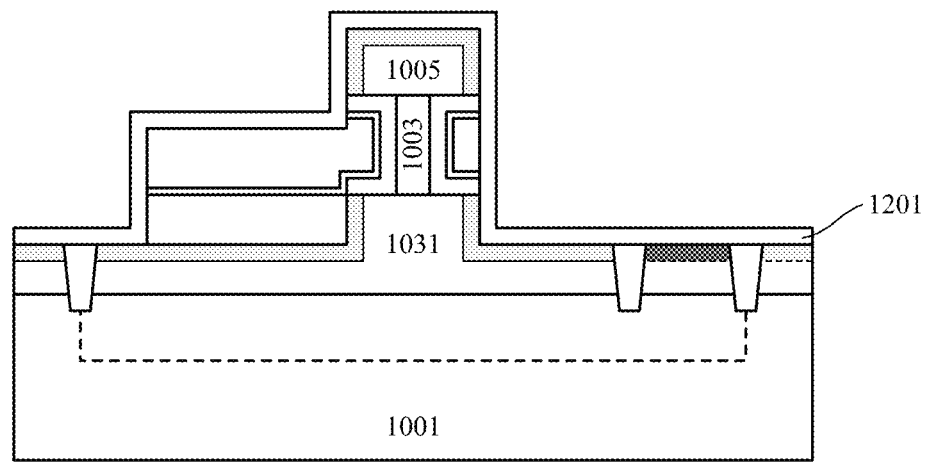
Figure 17:
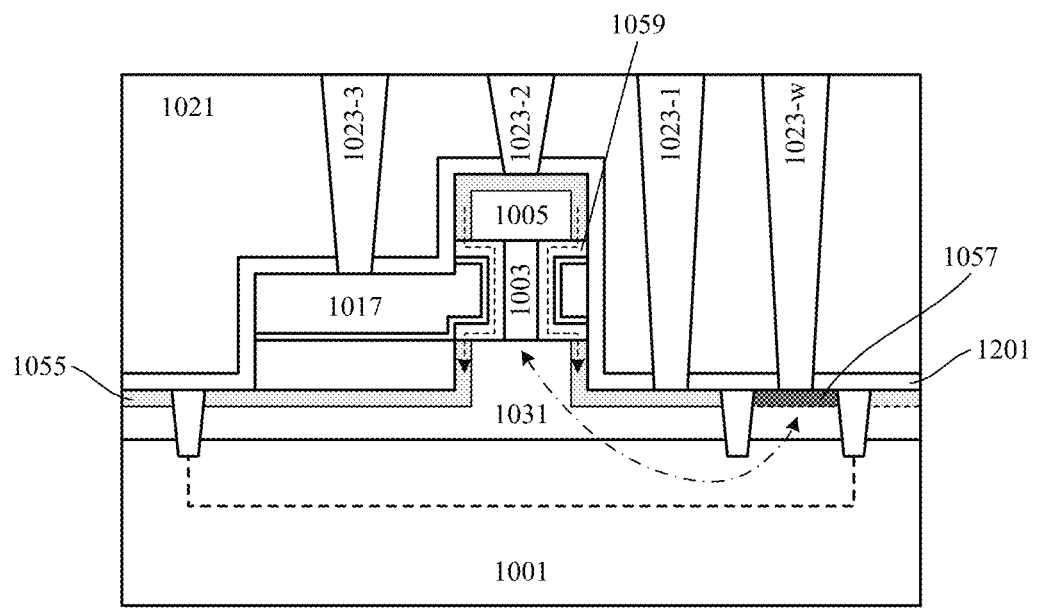

Then, as shown in FIG. 16, a liner 1201 may be formed on the structure of FIG. 15 by, for example, deposition. The liner 1201 may include nitride and may act as an etching stopper and a device protector. After that, as shown in FIG. 17, an interlayer dielectric layer 1021 may be formed on the structure shown in FIG. 16. For example, the interlayer dielectric layer 1021 may be formed by depositing oxide and then planarizing it by, for example, CMP. In the interlayer dielectric layer 1021, a contact 1023-1 to the source/drain region formed in the buffer layer 1031, a contact 1023-2 to the source/drain region formed in the semiconductor layer 1005, and a contact 1023-3 to the gate conductor layers 1017 may be formed. The contacts may be formed by etching holes in the interlayer dielectric layer 1021 and the liner 1201 and then filling a conductive material such as metal (for example, Tungsten) in the holes. Before depositing the metal, a diffusion barrier layer such as TiN may be formed.

In addition, a contact 1023-w to the contact region 1057 may be formed. As shown by the dotted arrow, a bias can be applied to the precursor channel layer 1003 through the contact region 1057, the well region formed in the substrate 1001 and the buffer layer 1031, and the buffer layer 1031 (especially, the portion thereof other than the source/drain region). Thus, the threshold voltage of the device can be changed. According to another embodiment, the semiconductor layer 1005 can be drilled to form an electrical contact to the body region of the precursor channel layer 1003.

In order to apply the bias conveniently, the portions of the buffer layer 1031 and/or the semiconductor layer 1005 other than the source/drain regions may be doped to a certain extent (for example, with the same doping type as the body region). Such doping can be done by, for example, ion implantation or in situ doping during growth. For the source/drain regions, doping can still be done in the manner described above, so as to have the desired conductivity type and doping concentration. Thus, the precursor channel layer 1003 or the body region therein may form an ohmic contact with the portions of the buffer layer 1031 and/or the semiconductor layer 1005 other than the source/drain regions. Certainly, the portions of the buffer layer 1031 and/or the semiconductor layer 1005 other than the source/drain regions may not be doped, as long as that the concentration of electrons or holes in the corresponding intrinsic semiconductor materials is relatively high It can be seen that the contacts may have different depths. Thus, different etching depths are required when etching the respective contact holes. The presence of the liner 1201 may facilitate the etching control of the contact holes. For example, etching of the interlayer dielectric layer 1021 may be stopped at the liner 1201.

Since the gate conductor layer 1017 extends beyond the periphery of the active region, the contact 1023-3 thereto can be easily formed. In addition, since the doping region in the buffer layer 1031 extends beyond the active region and has at least a portion thereof not covered by the gate conductor layer, the contact portion 1023-1 can be easily formed.

As shown in FIG. 17, the semiconductor device according to the embodiment comprises the buffer layer 1031, the precursor channel layer 1003 (in which the body region is formed) and the semiconductor layer 1005 stacked vertically, and the channel layer 1059 is formed around the periphery of the precursor channel layer 1003. The source/drain regions are formed in the buffer layer 1031 and the semiconductor layer 1005. The gate stack (1015/1017) is formed to surround the periphery of the channel layer 1059. As shown by the dashed arrow, current from one source/drain region may flow through the channel layer 1059 to the other source/drain region.

Figure 18:
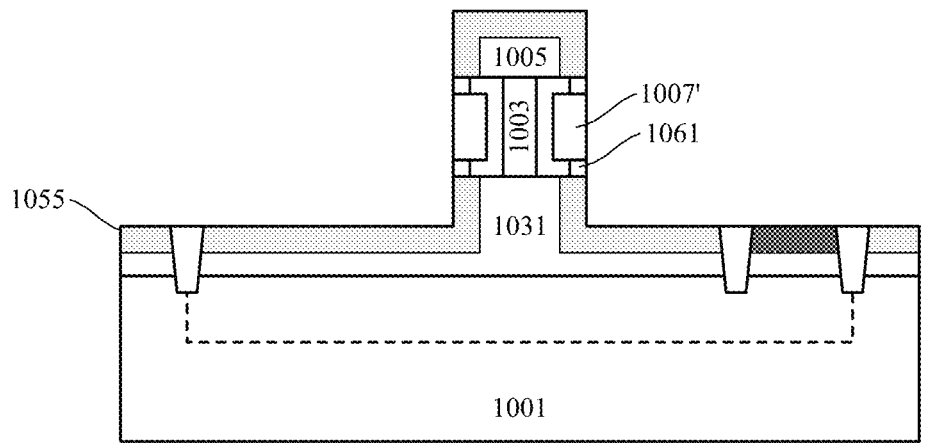
FIGS. 18 and 19 are schematic views showing some stages of a process of manufacturing a semiconductor device according to another embodiment of the present disclosure.
Figure 19:
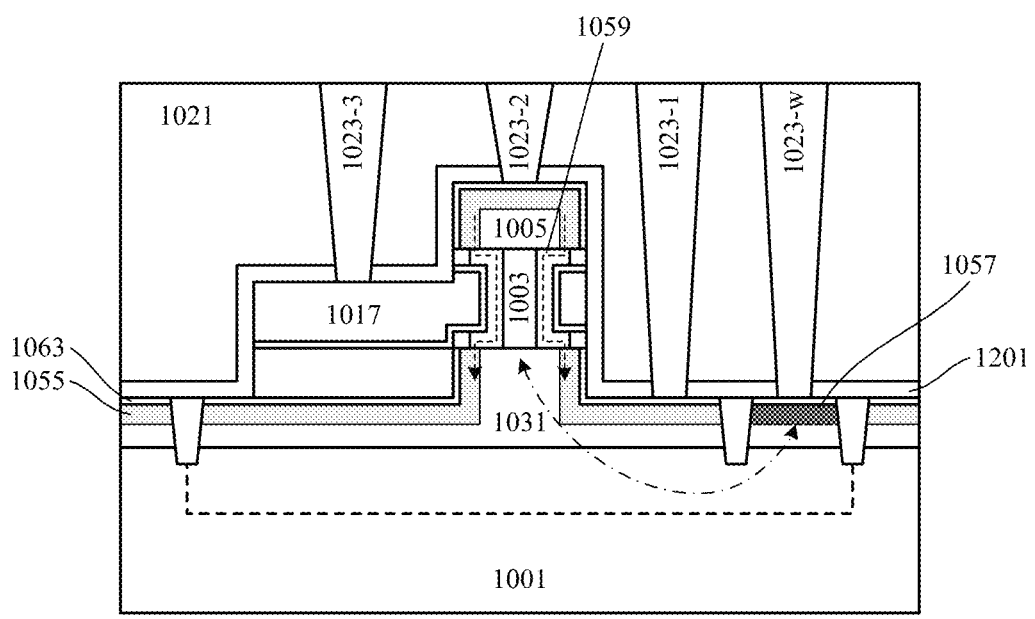

FIGS. 18 and 19 are schematic diagrams showing some stages of a process of manufacturing a semiconductor device according to another embodiment of the present disclosure. Hereinafter, the following descriptions focus on differences between the present embodiment and the above-described embodiments.

As shown in FIG. 18, in order to avoid possible leakage between the the silicide formed on the surfaces of the source/drain regions and the channel layer, after defining the active region and forming the source/drain regions as described above in connection with FIGS. 1 to 12, the ends of the channel layer 1059 may be recessed with respect to the surfaces of the source/drain regions. For example, the channel layer 1059 may be etched back (by, e.g., ALE) to retract its ends to a certain extent, and dielectric spacers 1061 (e.g., low k dielectric such as oxide, oxynitride, etc.) may formed therein. Thus, the dielectric spacer 1061 may surround the ends of the channel layer 1059 and may cause the ends of the channel layer 1059 to be disconnected from the silicide formed on the surfaces of the source/drain regions (there is no Schottky contact). Alternatively, there may be no material filled in the space formed after the back etching of the channel layer 1059, in other words, the space may be empty. Thus, an air spacer or an air gap may be formed. Certainly, the ends of the channel layer 1059 may still be connected to the source/drain regions to reduce the resistance between the source/drain regions and the channel regions.

Next, the above-described processes can be performed to obtain a device as shown in FIG. 19. Silicide 1063 formed on the surfaces of the source/drain regions is shown in FIG. 19. As shown in FIG. 19, the silicide 1063 is disconnected from the channel layer 1059.

According to another embodiment of the present disclosure, in order to reduce the resistance between the source/drain region and the channel region, after defining the active region and forming the source/drain regions as described above in connection with FIGS. 1 to 12, heat treatment (such as annealing) may be performed to drive a portion of the impurities from the source/drain regions to the channel layer 1059 (specifically, its ends overlapped with the source/drain regions), so that a doping distribution is formed at the ends of the channel layer 1059. Then, the above processes proceed. Certainly, a dielectric spacer or an air spacer surrounding the ends of the channel layer may also be formed as described in connection with FIGS. 18 and 19

Embodiments in which a cylindrical active region is formed is described above. Certainly, the active region in other shapes is also possible. An embodiment in which a rectangular or square active region is formed will be described below.

FIGS. 20 to 25(*d*) are schematic diagrams showing some stages of a process of manufacturing a semiconductor device according to another embodiment of the present disclosure. Hereinafter, the following descriptions focus on differences between the present embodiment and the above-described embodiments.

Figure 20:
FIGS. 20 to 25(*d*) are schematic views showing some stages of a process of manufacturing a semiconductor device according to another embodiment of the present disclosure.

As shown in FIG. 20, a substrate 2001 may be provided, and a buffer layer 2031, a precursor channel layer 2003 and another semiconductor layer 2005 may be grown on the substrate 2001. For details of the substrate and these semiconductor layers, reference may be made to the above description in conjunction with FIG. 1. Likewise, a well region (as indicated by the dashed box in the figure) may be formed in the substrate 2001 and the buffer layer 2031, and the precursor channel layer 2003 may be doped to a certain extent.

In order to form a rectangular or square active area, a cross spacer image transfer (xSIT) technology is proposed. To this end, two spacers respectively extending in crossing directions (e.g., substantially perpendicular to each other) may be formed, and an intersection of the two spacers may define a square or rectangular mask shape.

Figure 21A:
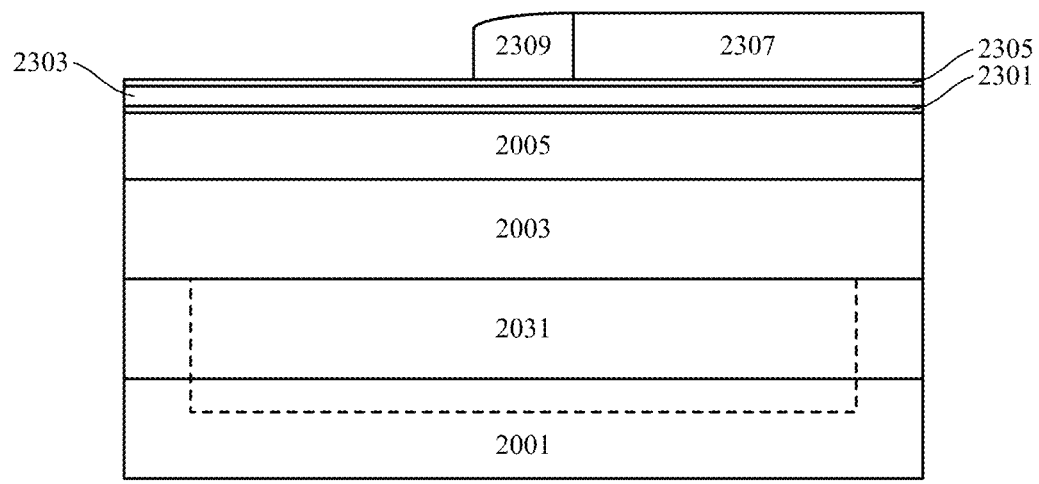
Figure 21B:
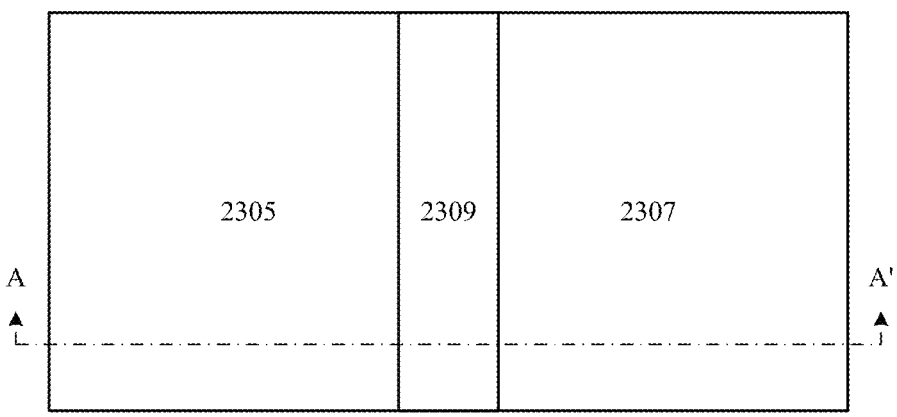

For example, as shown in FIGS. 21(*a*) and 21(*b*) (FIG. 21(*a*) is a cross-sectional view, and FIG. 21(*b*) is a top view with line AA' indicating the location where the sectional view is taken), a mask layer is formed on the structure shown in FIG. 20. Here, the mask layer may include a stack of oxide 2301 (e.g., with a thickness of about 2-10 nm)—nitride 2303 (e.g., with a thickness of about 10-100 nm)—oxide 2305 (e.g., with a thickness of about 2-10 nm). The mask layer in the stack form is common itself. In the stack, it is the nitride layer 2302 that mainly acts as a mask, and the oxide layers 2301, 2303 are primarily intended for etch stopping.

On the mask layer, a first spacer extending in a first direction (e.g., a vertical direction in the figure) may be formed. For this purpose, an auxiliary pattern 2307 is formed by, for example, deposition. For example, the auxiliary pattern 2307 may include amorphous silicon or polysilicon. The auxiliary pattern 2307 may be subjected to a planarization process such as CMP. The auxiliary pattern 2307 may be patterned to have one side wall thereof corresponding to a side wall of the active area to be formed. On the side wall of the auxiliary pattern 2307, a first spacer 2309 may be formed by a spacer forming process. The first spacer 2309 may include nitride with a width corresponding to the dimension of one side (length or width) of the active region to be formed, for example about 10-100 nm. For example, a layer of nitride may be deposited in a substantially conformal manner and the deposited nitride may be subjected to RIE in a direction substantially perpendicular to the substrate surface. The RIE may be stopped at the oxide 2305. As a result, the nitride layer has its horizontally extending portion removed and its vertically extending portion remained, thereby resulting in the first spacer 2309. Thereafter, the auxiliary pattern 2307 may be removed by selective etching such as RIE.

Figure 22A:
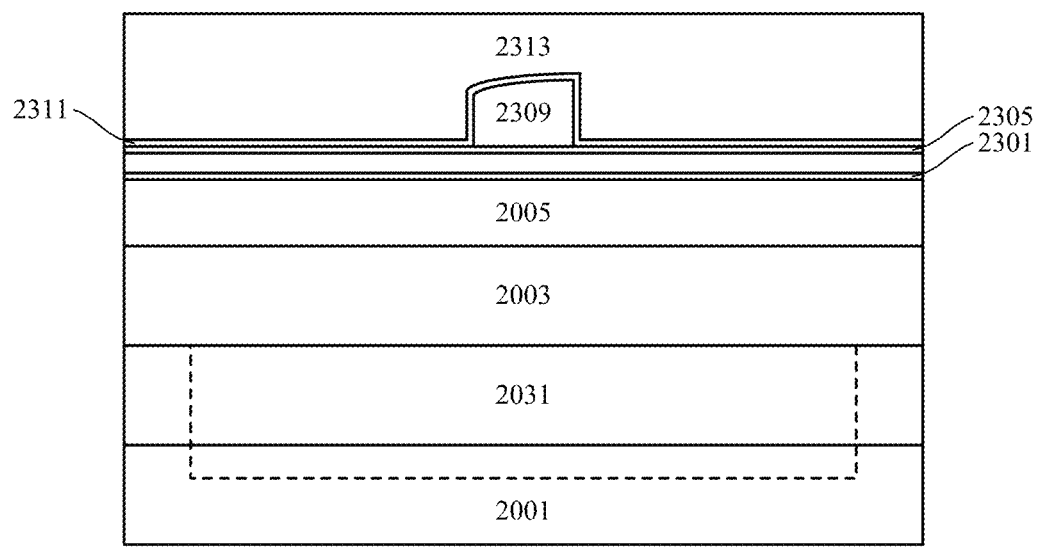
Figure 22B:
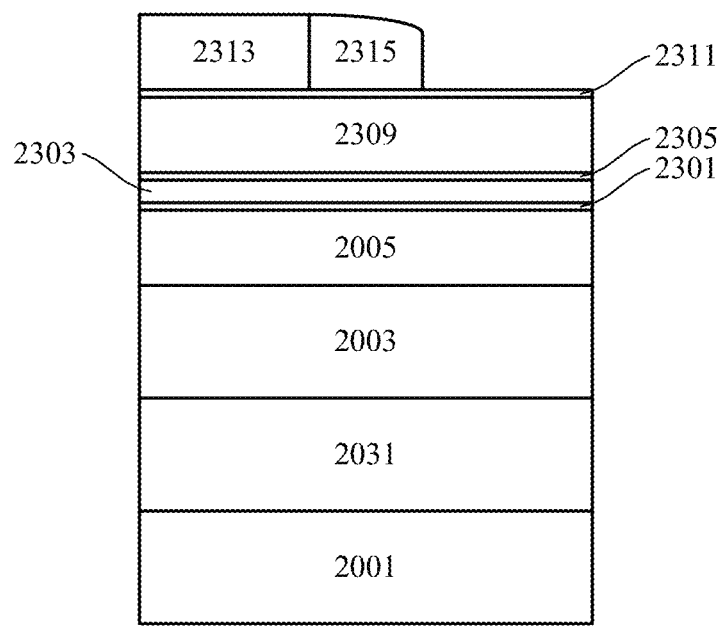
Figure 22C:
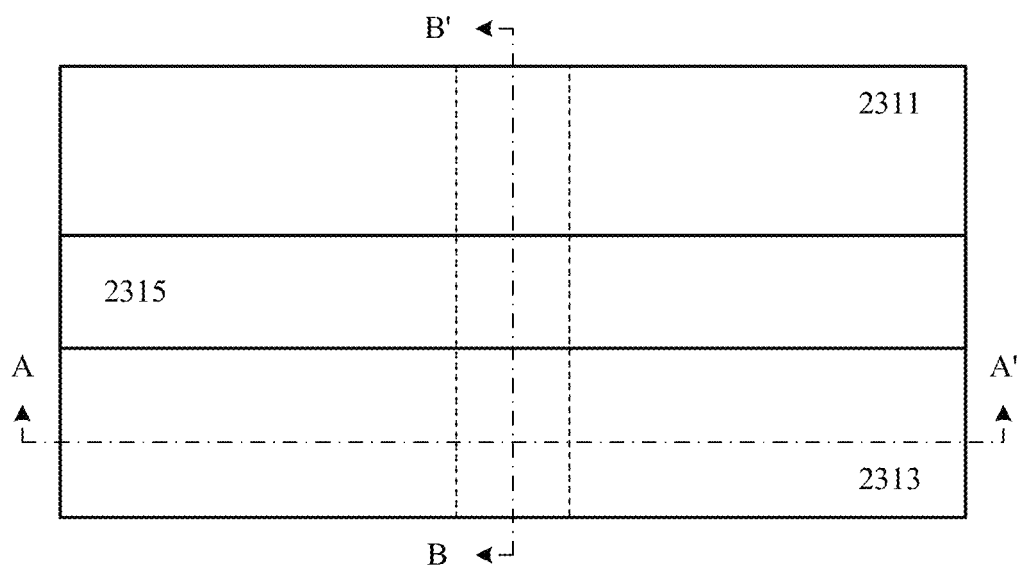

Next, a second spacer extending in a second direction (e.g., a horizontal direction in the figure) crossing the first direction may be formed on the mask layer. This can be done according to the same process as the first spacer. For example, as shown in FIGS. 22(a), 22(b) and 22(c) (FIGS. 22(a) and 22(b) are cross-sectional views, and FIG. 22(c) is a top view with lines AA' and BB' indicating the locations where the sectional views are taken), an auxiliary pattern 2313 may be formed by, for example, deposition. For example, the auxiliary pattern 2313 may include amorphous silicon or poly-silicon. The auxiliary pattern 2313 may be subjected to a planarization process such as CMP. The auxiliary pattern 2313 may be patterned to have one side wall thereof corresponding to a sidewall of the active area to be formed. On the side wall of the auxiliary pattern 2313, the second spacer 2315 may be formed by a spacer forming process. The second spacer 2315 may include a different material from the first spacer 2309, such as oxynitride, to provide etching selectivity. The second spacer may have a width corresponding to the dimension of another side (width or length) of the active region to be formed, for example, about 5-50 nm. After that, the auxiliary pattern 2313 can be removed.

Figure 23A:
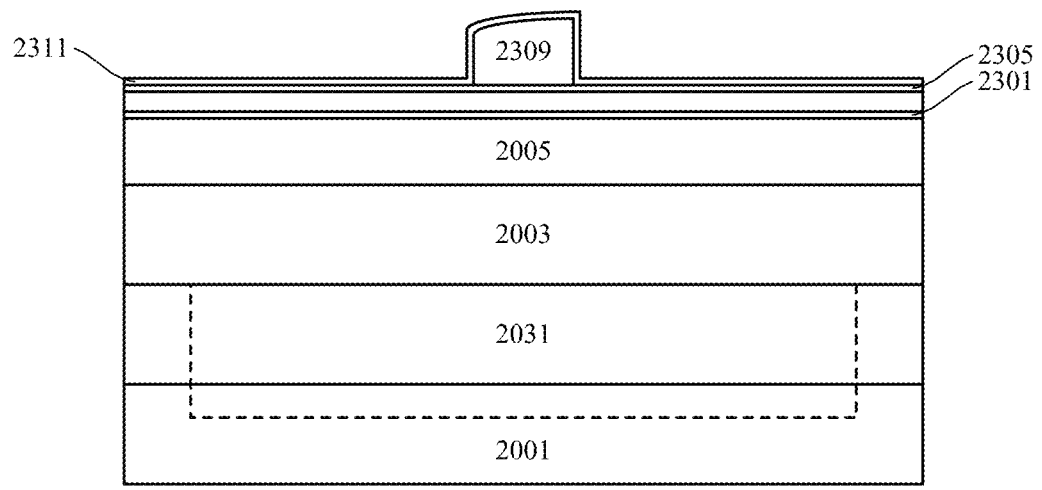
Figure 23B:
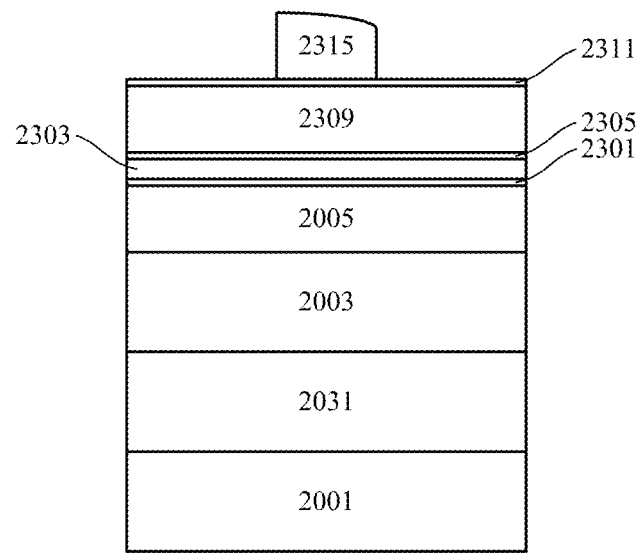
Figure 23C:
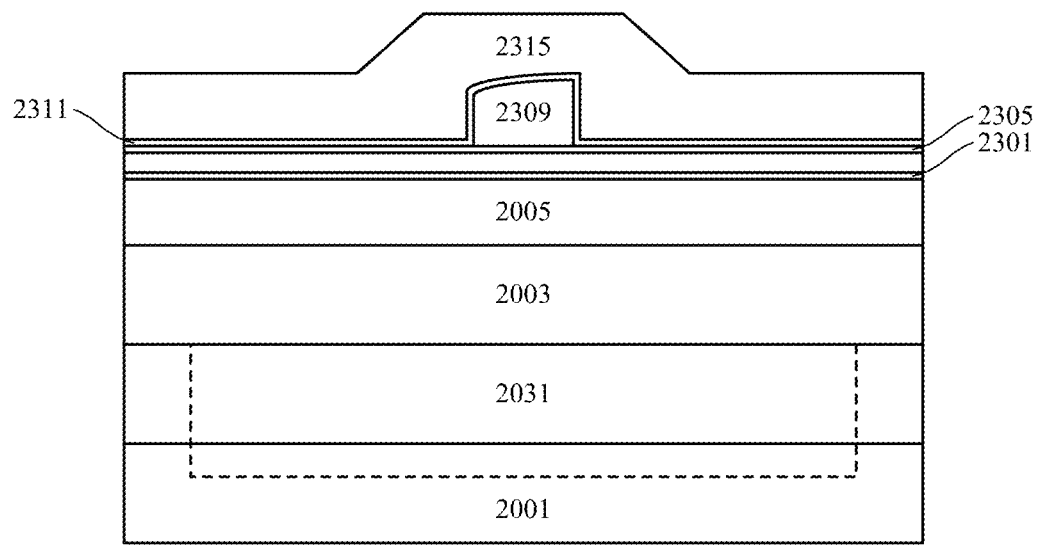
Figure 23D:
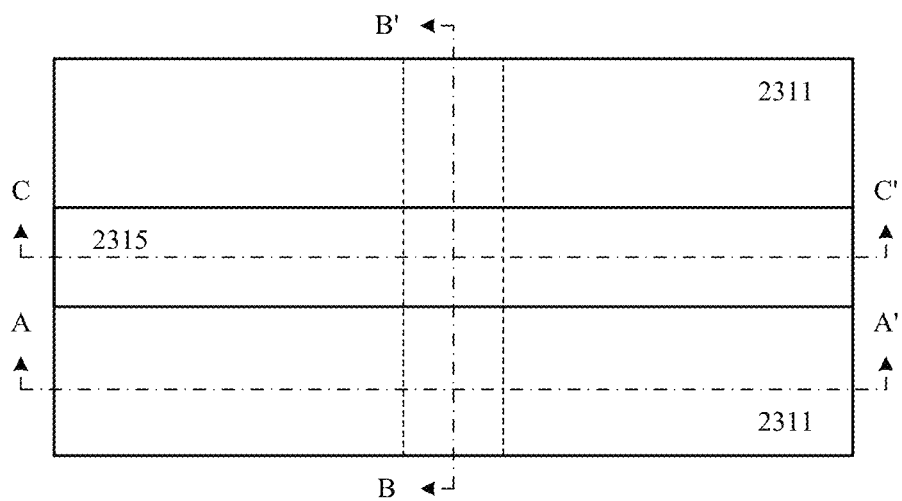

In addition, before forming the auxiliary pattern 2313 and the second spacer 2315, a thin oxide layer 2311 may be formed by, for example, deposition, for etch stopping. Certainly, the thin oxide layer 2311 may also be omitted Afterwards, as shown in FIGS. 23(a), 23(b), 23(c) and 23(d) (FIGS. 23(a), 23(b) and 23(c) are cross-sectional views, and FIG. 23(d) is a top view with lines AA', BB' and CC' indicating the locations where the sectional views of FIGS. 23(a), 23(b) and 23(c) are taken), the auxiliary pattern 2313 is removed by selective etching, such as RIE. The RIE may stop at the oxide layer 2311. Thus, as shown in FIG. 23(d), the first spacer 2309 (shown by the dashed box) and the second spacer 2315 intersecting each other are remained on the mask layer, and their overlapping portions define a rectangular or square shape. After that, the shape can be transferred to the mask layer and used to define the active area.

Figure 24A:
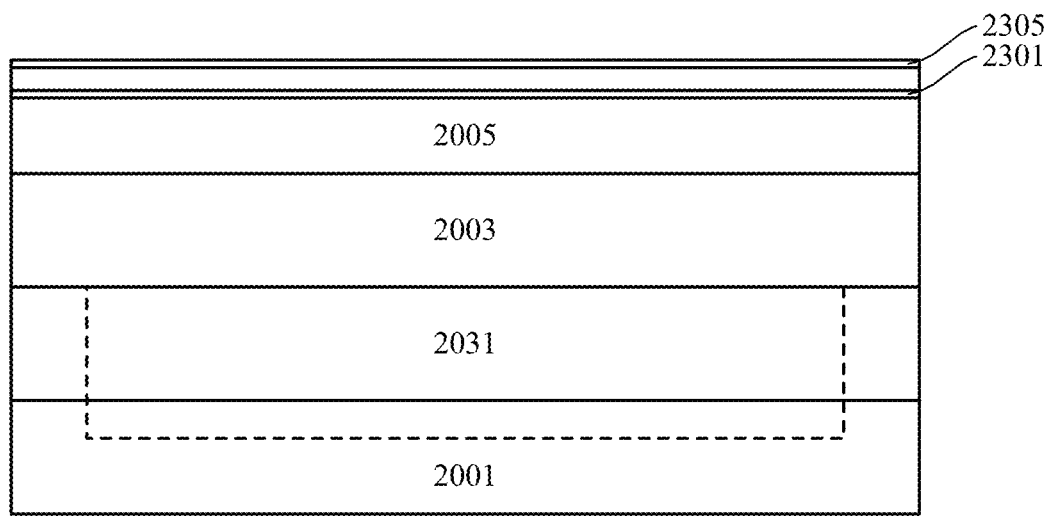
Figure 24B:
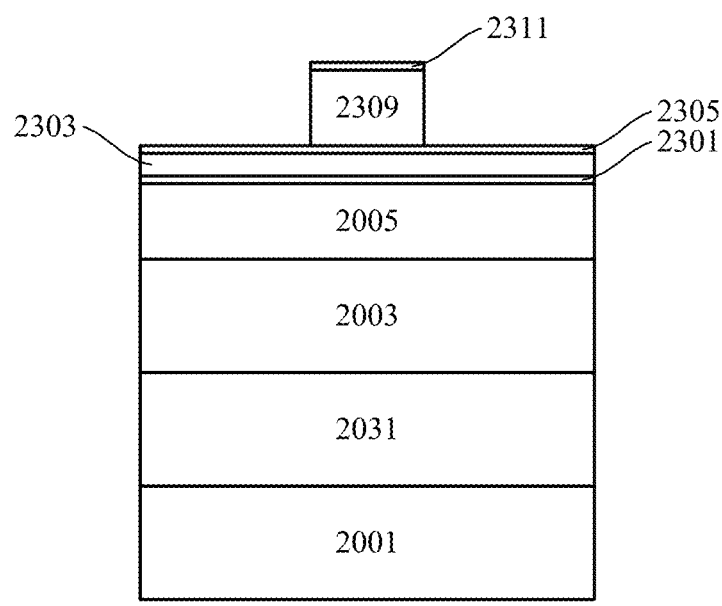
Figure 24C:
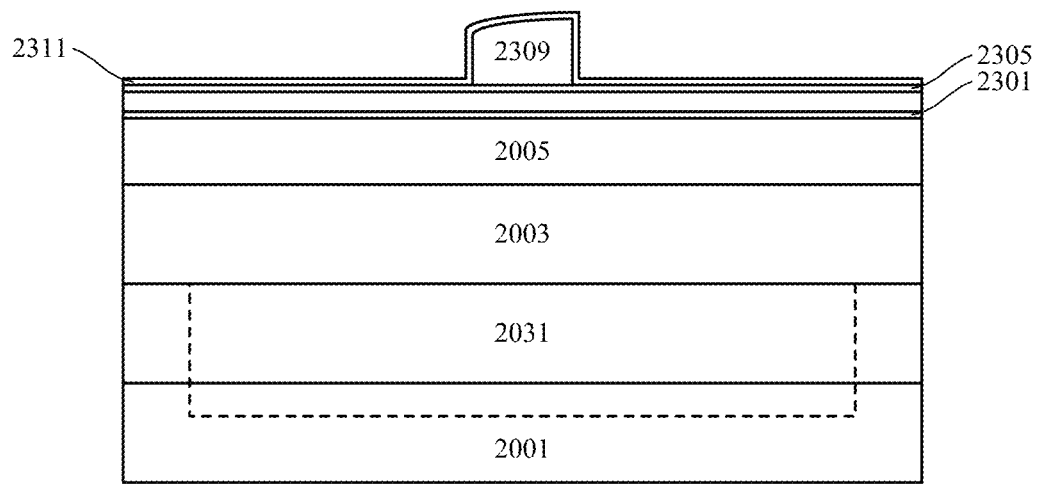
Figure 24D:
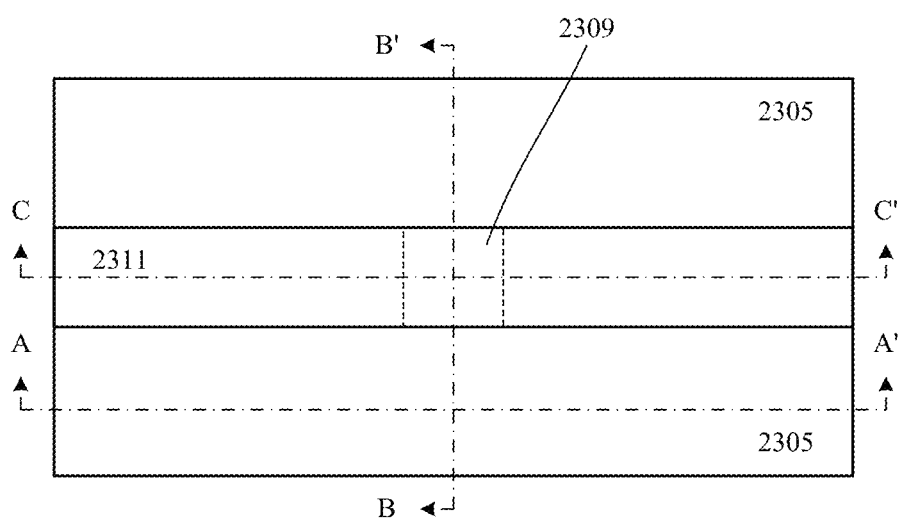

As shown in FIGS. 24(a), 24(b), 24(c) and 24(d) (FIGS. 24(a), 24(b) and 24(c) are cross-sectional views, and FIG. 24(d) is a top view with lines AA', BB' and CC' indicating the locations where the sectional views of FIGS. 24(a), 24(b) and 24(c) are taken), the first spacer 2309 is patterned with the second spacer 2315. Specifically, selective etching such as RIE may performed on the oxide layer 2311 (thereby exposing the first spacer 2309, and in the case where the oxide layer 2311 is omitted as described above, the operation can be omitted) and the first spacer 2309 (in this example, the nitride) in sequence with the presence of the second spacer 2315. When performing RIE on the oxide layer 2311, the oxide layer 2305 in the mask layer may be etched. The thickness of the oxide layer 2305 may be relatively thick and thus not removed. Thereafter, the second spacer 2315 (in this example, oxynitride) may be removed by selective etching such as RIE. As shown by the dashed box in FIG. 24(d), a rectangular or square portion of the first spacer 2309 is left. In addition, at the position where the second spacer is originally located there is still the thin oxide layer 2311, and at other positions the top surface of the mask layer (the top surface of the oxide layer 2305) is exposed.

Figure 25A:
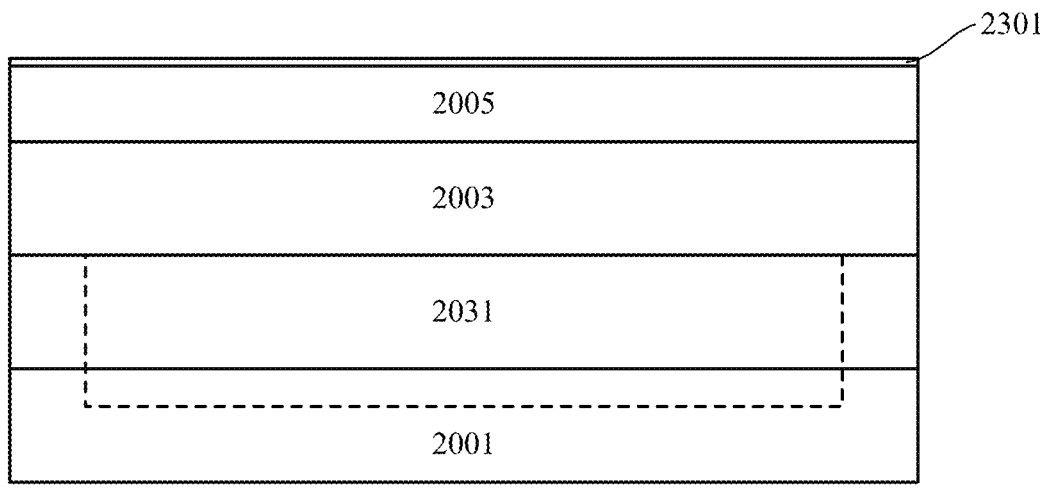
Figure 25B:
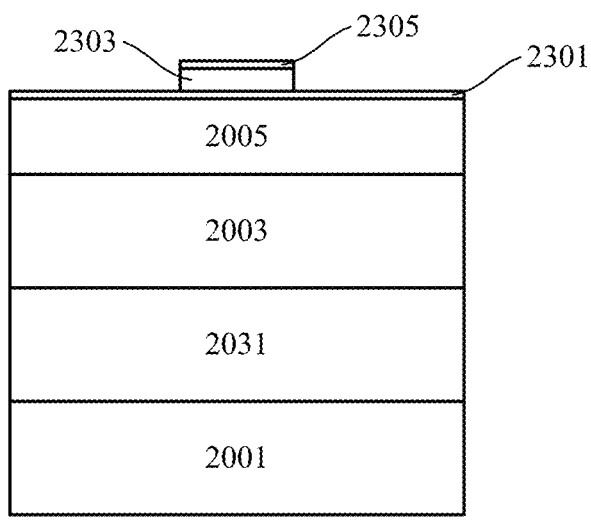
Figure 25C:
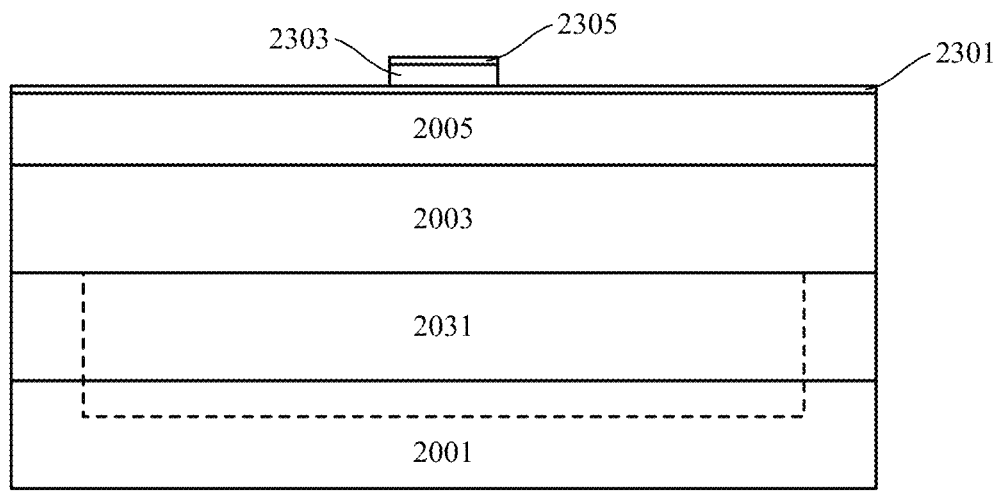
Figure 25D:
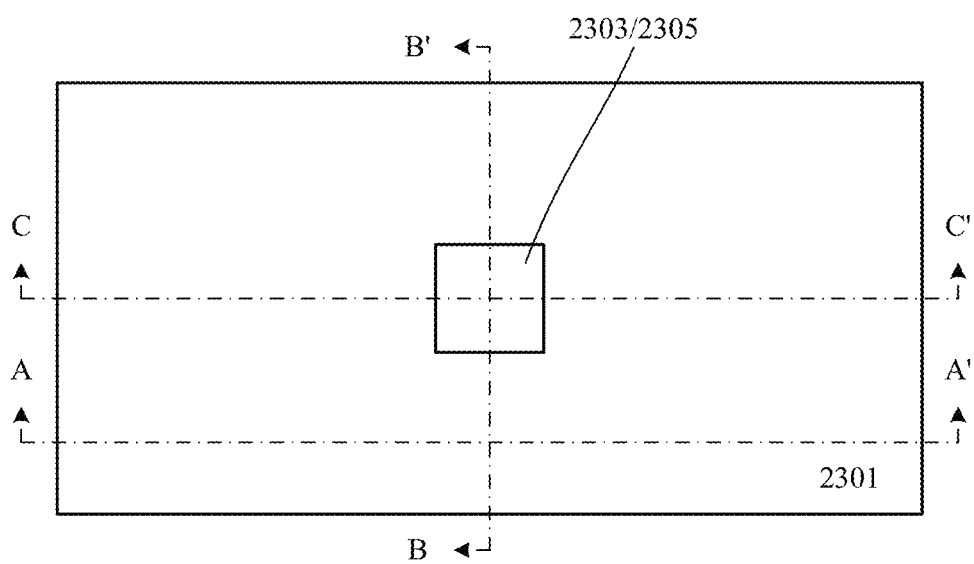

Then, such a shape can be transferred to the mask layer. As shown in FIGS. 25(a), 25(b), 25(c) and 25(d) (FIGS. 25(a), 25(b) and 25(c) are cross-sectional views, and FIG. 25(d) is a top view with lines AA', BB' and CC' indicating the locations where the sectional views of FIGS. 25(a), 25(b) and 25(c) are taken), the oxide layer and the nitride layer are patterned by selective etching such as RIE. In performing the RIE on the oxide layer, the remaining thin oxide layer 2311 and a portion of the oxide layer 2305 other than that covered by the first spacer 2309 are removed, exposing the underlying nitride layer 2303. Then, in performing the RIE on the nitride layer, these exposed portions of the nitride layer are removed. Here, the first spacer 2309 is also nitride, and therefore can be removed. The RIE of the nitride may be stopped at the oxide layer. Since the oxide layer 2305 is present below the first spacer 2309, a portion of the nitride layer 2303 under the first spacer 2309 can be retained. Thus, as shown in FIG. 25(d), a mask (the nitride layer 2305) with a shape defined by the intersection of the first spacer and the second spacer is remained. Thereafter, the active region may be defined by using the mask, and the semiconductor device may be fabricated in accordance with the same process as described above, and detailed descriptions will be omitted here.

The semiconductor device according to the embodiments is applicable to various electronic devices. For example, an Integrated Circuit (IC) may be formed by integrating a plurality of such semiconductor arrangements and also other devices (for example, transistors in other forms or the like), from which an electronic device may be made. Therefore, the present disclosure further provides an electronic device comprising the above semiconductor device. The electronic device may also comprise components such as a display operatively coupled to the IC and a wireless transceiver operatively coupled to the IC, or the like. Such an electronic device may comprise, for example, a smart phone, a computer, a tablet Personal Computer (PC), an artificial intelligence, a wearable smart device, a mobile power supply, or the like.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A semiconductor device, comprising:
a substrate;
a first source/drain layer, a channel layer and a second source/drain layer, which are stacked in sequence on the substrate, wherein the channel layer includes a channel region close to a peripheral surface of the channel layer and a body region disposed on an inner side of the channel region, and wherein the first source/drain layer comprises a source/drain region close to a peripheral surface of the first source/drain layer and a substantially undoped or lightly doped portion disposed on a laterally inner side of the source/drain region;
a gate stack surrounding the peripheral surface of the channel layer and including a gate electrode and a gate dielectric interposed between the gate electrode and the peripheral surface of the channel layer;
a source/drain contact connected to the source/drain region of the first source/drain layer; and
a body contact for applying a bias via the substantially undoped or lightly doped portion of the first source/drain layer to the body region in the channel layer.

2. The semiconductor device of claim 1, wherein the body region comprises a doped well region.

3. The semiconductor device of claim 2, wherein the well region constitutes an ultra-steep well structure with respect to the channel region.

4. The semiconductor device of claim 1, wherein there is a doping interface or a crystal interface between the body region and the channel region.

5. The semiconductor device of claim 1, wherein the body region, the channel region and the gate dielectric layer constitute a quantum well structure.

6. The semiconductor device of claim 1, wherein the channel layer comprises a first semiconductor material and a second semiconductor material surrounding a periphery of the first semiconductor material.

7. The semiconductor device of claim 6, wherein the body region is substantially formed in the first semiconductor material and the channel region is substantially formed in the second semiconductor material.

8. The semiconductor device of claim 6, wherein the periphery of the first semiconductor material is recessed with respect to that of the first and second source/drain regions, and the second semiconductor material is formed in the recess of the periphery of the first semiconductor material with respect to that of the first and second source/drain regions.

9. The semiconductor device of claim 6, wherein the second semiconductor material is formed as a thin film surrounding the periphery of the first semiconductor material, with a thickness of about 2-10 nm.

10. The semiconductor device of claim 6, wherein the second semiconductor material forms a heterojunction with respect to at least one of the first source/drain layer, the second source/drain layer and the first semiconductor material.

11. The semiconductor device of claim 6, wherein, for an n-type device, an concentration of electrons in the second semiconductor material is greater than that in the first semiconductor material in an ON state; and
for a p-type device, a concentration of holes in the second semiconductor material is greater than that in the first semiconductor material in an ON state.

12. The semiconductor device of claim 6, wherein, for an n-type device, the second semiconductor material has a conduction band at an energy level lower than that in the first semiconductor material; and
for a p-type device, the second semiconductor material has a valence band at an energy level higher than that in the first semiconductor material.

13. The semiconductor device of claim 6, wherein, the second semiconductor material comprises a group IV semiconductor material or a group III-V group compound semiconductor, such as, any one of SiGe, Ge, SiGeSn, GeSn, GaAs, InGaAs, InP, AlGaAs, InAlAs, InAs, InGa, InAlGa, GaN, InSb, InGaSb or any combination thereof; and
the first semiconductor material comprises a group IV semiconductor material or a group III-V compound semiconductor, such as, any one of SiGe, Ge, SiGeSn, GeSn, GaAs, InGaAs, InP, AlGaAs, InAlAs, InAs, InGa, InAlGa, GaN, InSb, InGaSb or any combination thereof.

14. The semiconductor device of claim 13, wherein, the first and second source/drain layers comprise a group IV semiconductor material or a group III-V compound semiconductor, such as, any one of SiGe, Ge, SiGeSn, GeSn, GaAs, InGaAs, InP, AlGaAs, InAlAs, InAs, InGa, InAlGa, GaN, InSb, InGaSb or any combination thereof.

15. The semiconductor device of claim 14, wherein the first semiconductor material comprises SiGe, and the second semiconductor material also comprises SiGe, wherein the second semiconductor material has a concentration of Ge increasing gradually from a surface thereof close to the first semiconductor material to a surface thereof away from the first semiconductor material; or
the first semiconductor material comprises SiGe, and the second semiconductor material also comprises SiGe, wherein the second semiconductor material has a concentration of Ge decreasing gradually from a surface thereof close to the first semiconductor material to a surface thereof away from the first semiconductor material.

16. The semiconductor device of claim 6, wherein the first semiconductor material is in a pillar shape extending vertically, and wherein the second semiconductor material comprises a vertical portion extending along sidewalls of the pillar-shaped first semiconductor material and horizontal portions extending from upper and lower ends of the vertical portion in a direction away from the vertical portion, so that the semiconductor material layer is in a C shape in a sectional view.

17. The semiconductor device of claim 1, wherein for an n-type device, the body region is p-type doped; and
for a p-type device, the body region is n-type doped.

18. The semiconductor device of claim 17, wherein for the n-type device, the body region has a p-type doping concentration decreasing as a distance from the gate stack decreases; and
for the p-type device, the body region has an n-type doping concentration decreasing as a distance from the gate stack decreases.

19. The semiconductor device of claim 1, wherein the second source/drain layer comprises a source/drain region close to a peripheral surface of the second source/drain layer.

20. The semiconductor device of claim 19, wherein portions of the second source/drain layer other than the source/drain region are substantially undoped or lightly doped.

21. The semiconductor device of claim 20, wherein the substantially undoped or lightly doped portions form an ohmic contact with the body region in the channel layer.

22. The semiconductor device of claim 19, wherein the channel region has ends connected to the respective source/drain regions.

23. The semiconductor device of claim 22, further comprising a dielectric spacer, surrounding the ends of the channel region, to cause the ends of the channel region to be recessed with respect to the peripheral surfaces of the respective source/drain regions and to be still connected with the respective source/drain regions.

24. The semiconductor device of claim 23, wherein the dielectric spacer comprise dielectric with a low dielectric constant or air.

25. The semiconductor device of claim 23, further comprising silicide formed on the surfaces of the source/drain regions.

26. The semiconductor device of claim 22, wherein the ends of the channel region are doped to a certain extent.

27. The semiconductor device of claim 19, wherein the source/drain regions in the first and second source/drain layers have different conductivity types.

28. An electronic device comprising an Integrated Circuit (IC) comprising the semiconductor device according to claim 1.

29. The electronic device of claim 28, further comprising a display operatively coupled to the IC and a wireless transceiver operatively coupled to the IC.

30. The electronic device of claim 28, wherein the electronic device comprises a smart phone, a computer, a tablet computer, an artificial intelligence, a wearable smart device, or a mobile power supply.

\* \* \* \* \*